(12) United States Patent
Kurahashi et al.

(10) Patent No.: US 8,470,653 B2
(45) Date of Patent: Jun. 25, 2013

(54) METHOD FOR MANUFACTURING A P-TYPE MOS TRANSISTOR, METHOD FOR MANUFACTURING A CMOS-TYPE SEMICONDUCTOR APPARATUS HAVING THE P-TYPE MOS TRANSISTOR, AND CMOS-TYPE SEMICONDUCTOR APPARATUS MANUFACTURED USING THE MANUFACTURING METHOD

(75) Inventors: Teruo Kurahashi, Kawasaki (JP); Yasuyoshi Mishima, Ebina (JP); Yukie Sakita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 581 days.

(21) Appl. No.: 12/541,556

(22) Filed: Aug. 14, 2009

(65) Prior Publication Data
US 2010/0044799 A1 Feb. 25, 2010

Related U.S. Application Data

(63) Continuation of application No. PCT/JP2007/052829, filed on Feb. 16, 2007.

(51) Int. Cl.
*H01L 27/092* (2006.01)
(52) U.S. Cl.
USPC .......................... 438/183; 438/199; 257/369
(58) Field of Classification Search
USPC ................... 438/183, 199; 257/369, E21.453
See application file for complete search history.

(56) References Cited

U.S. PATENT DOCUMENTS

| 6,677,222 | B1 * | 1/2004 | Mishima et al. ............. 438/488 |
| 2005/0269640 | A1 | 12/2005 | Shimamoto et al. |
| 2005/0285206 | A1 | 12/2005 | Kadoshima et al. |
| 2006/0125381 | A1 * | 6/2006 | Oh ................................ 313/504 |
| 2009/0115002 | A1 | 5/2009 | Tatsumi et al. |

FOREIGN PATENT DOCUMENTS

| JP | 6-13402 A | 1/1994 |
| JP | 8-274185 A | 10/1996 |
| JP | 2005-243664 A | 9/2005 |
| JP | 2005-294704 A | 10/2005 |
| JP | 2005-294799 A | 10/2005 |
| JP | 2005-347605 A | 12/2005 |
| JP | 2006-13270 A | 1/2006 |
| WO | 2006/137371 A1 | 12/2006 |

OTHER PUBLICATIONS

International Search Report of PCT/JP2007/052829, Mailing Date of May 22, 2007.
Japanese Office Action dated Aug. 7, 2012, issued in corresponding Japanese Patent Application No. 2008-557956, (6 pages). With English Translation.

* cited by examiner

*Primary Examiner* — Daniel Whalen
*Assistant Examiner* — Suberr Chi
(74) *Attorney, Agent, or Firm* — Westerman, Hattori, Daniels & Adrian, LLP

(57) ABSTRACT

A method for manufacturing a P-type MOS transistor includes forming a gate insulating film on the substrate, forming a gate electrode from amorphous silicon containing no impurities on the gate insulating film, performing a heat treatment for controlling the film characteristics of the amorphous silicon, depositing a nickel (Ni) layer on the gate electrode, and forming nickel silicides from the gate electrode and the nickel (Ni).

15 Claims, 22 Drawing Sheets

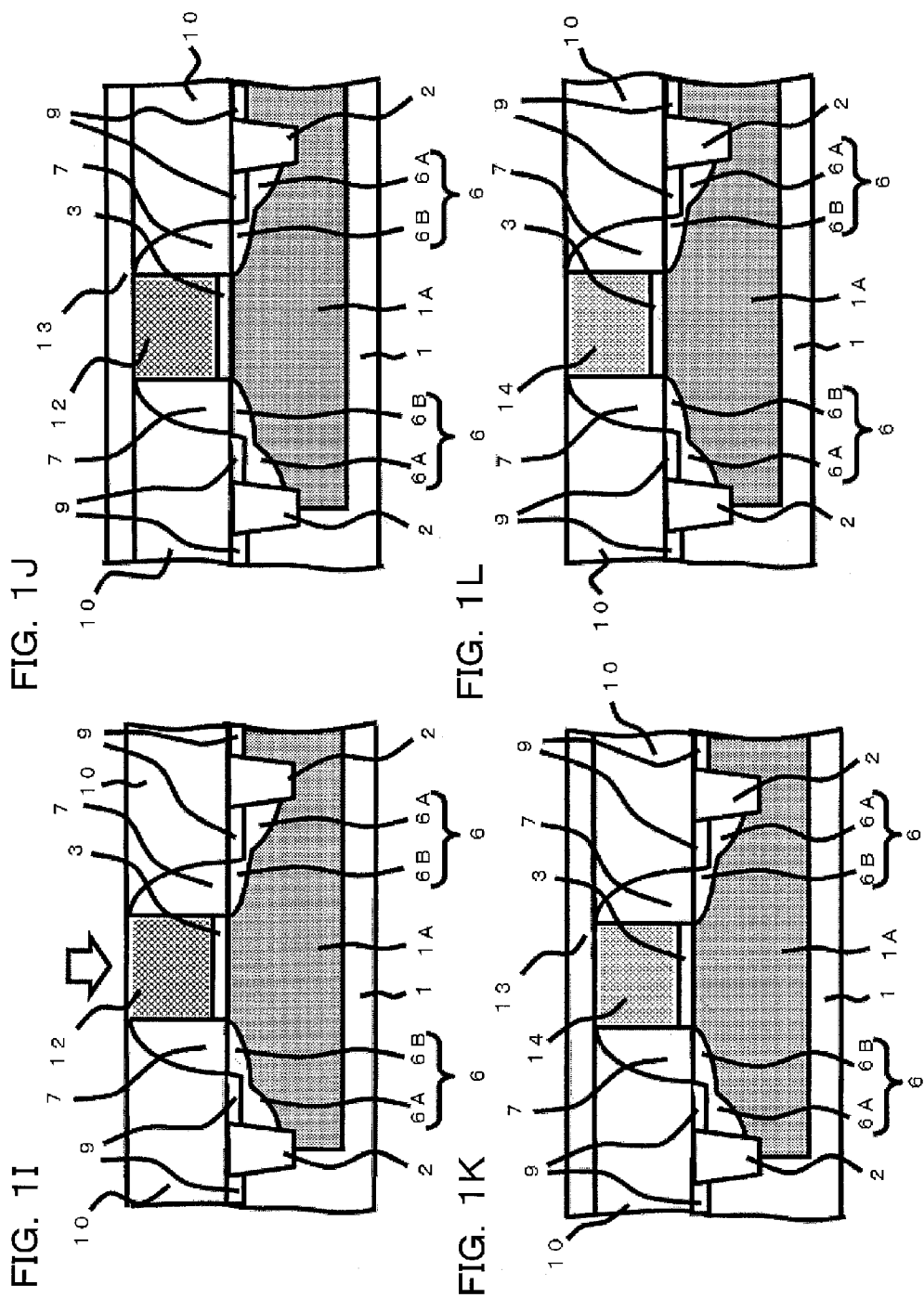

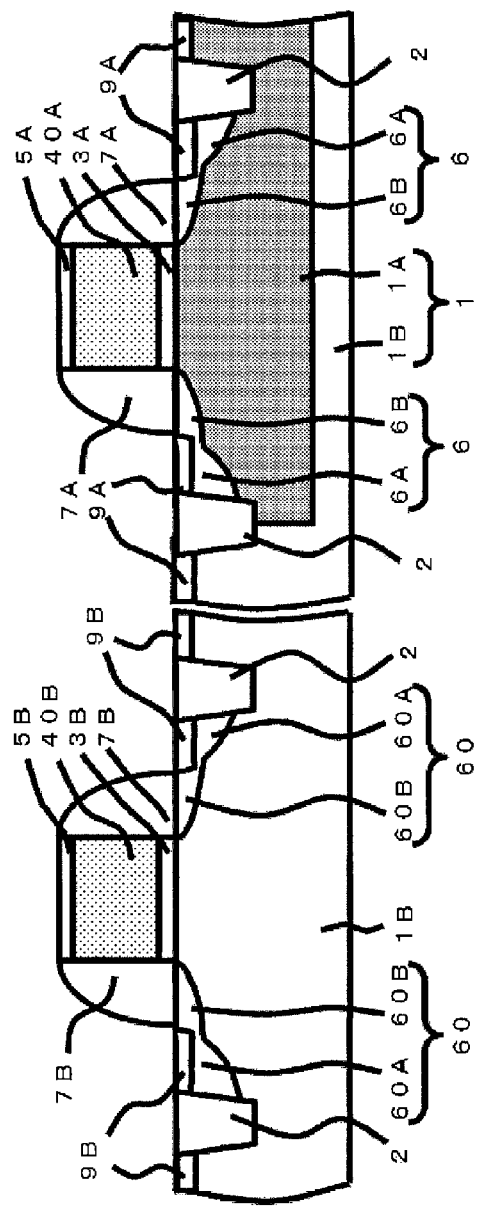

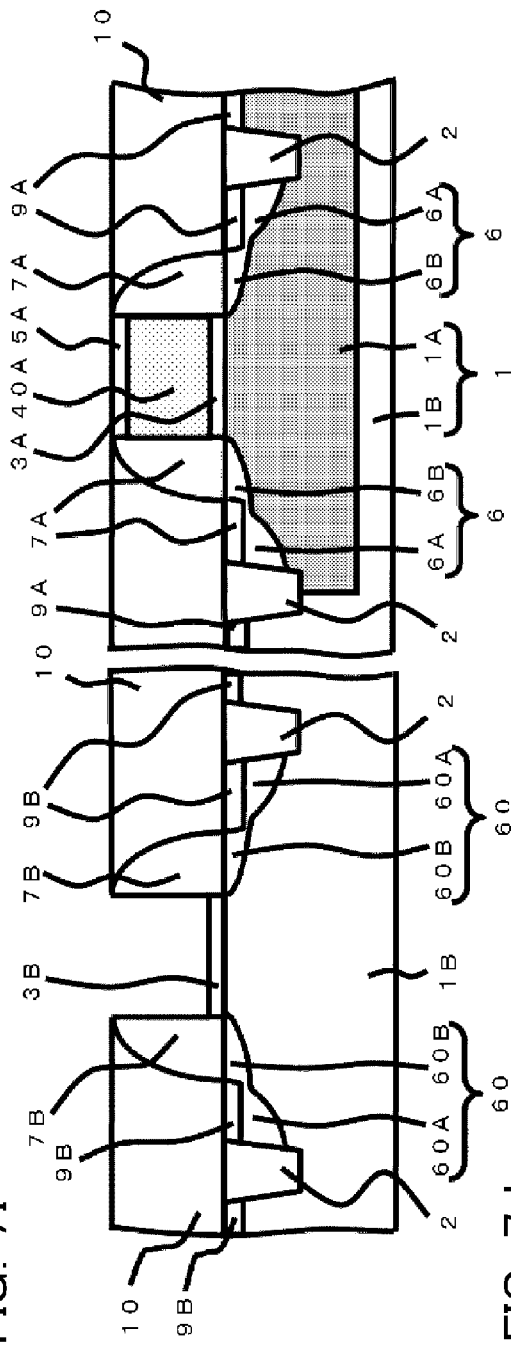
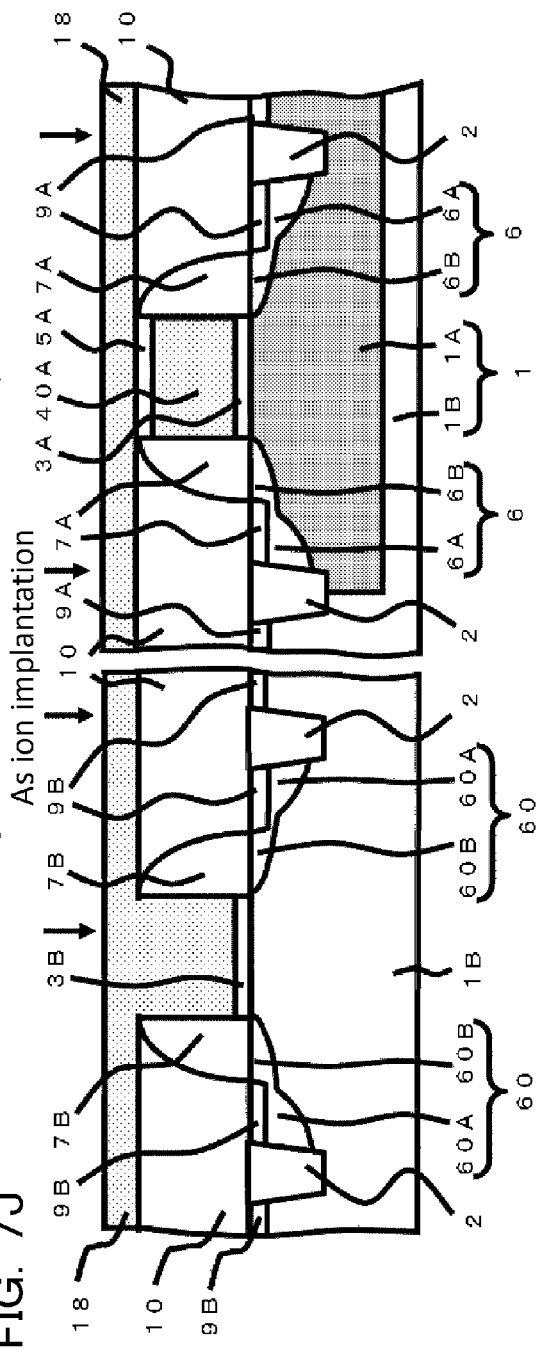

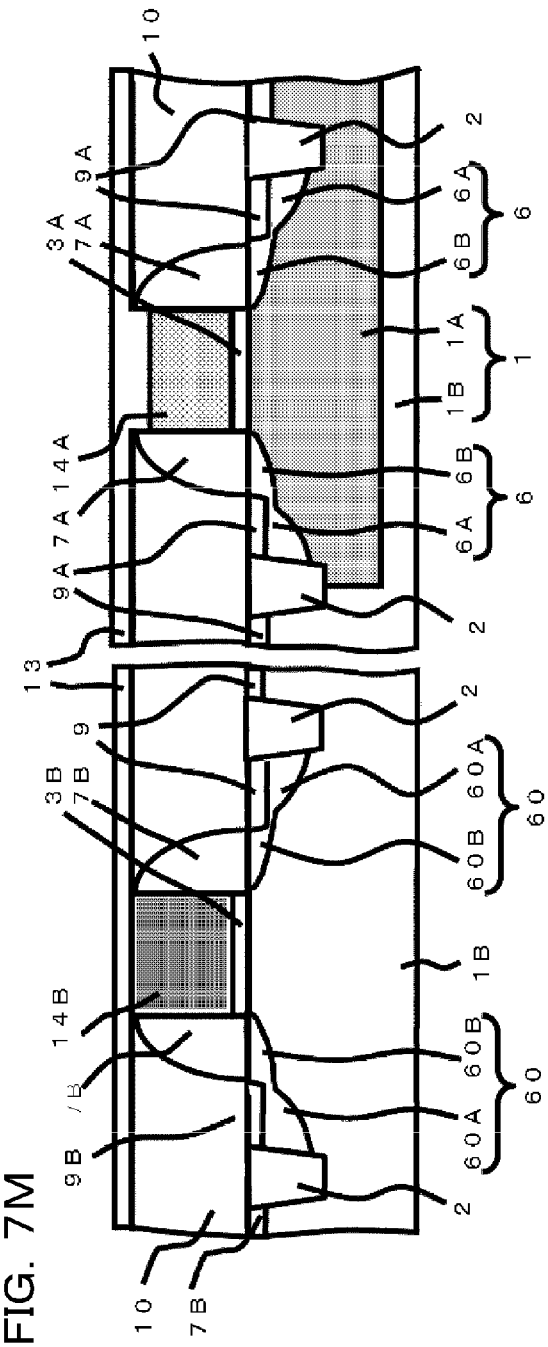

METHOD FOR MANUFACTURING A P-TYPE MOS TRANSISTOR, METHOD FOR MANUFACTURING A CMOS-TYPE SEMICONDUCTOR APPARATUS HAVING THE P-TYPE MOS TRANSISTOR, AND CMOS-TYPE SEMICONDUCTOR APPARATUS MANUFACTURED USING THE MANUFACTURING METHOD

CROSS REFERENCE TO RELATED APPLICATION

This is a continuation of Application PCT/JP2007/052829, filed on Feb. 16, 2007, the entire contents of which are incorporated herein by reference.

FIELD

The embodiments discussed herein are relates to a method for manufacturing a P-type MOS transistor whose gate electrode is made of nickel silicides, a P-type MOS transistor manufactured using the manufacturing method, a method for manufacturing a CMOS-type semiconductor apparatus having such a P-type MOS transistor, and a CMOS-type semiconductor apparatus.

BACKGROUND

As materials of source/drain electrodes and gate electrodes used in MOS transistors formed on silicon substrates, metal silicides, namely, compounds made of a metal and silicon, are used in order that the resistance of the aforementioned electrodes will be reduced. From the viewpoint of reducing the resistance of gate electrodes and controlling the work functions of materials of gate electrodes, a group of metal silicides, nickel silicides, seems promising as a technology that realizes next-generation semiconductor apparatuses.

When the gate electrode of a P-type MOS transistor is totally made of nickel silicides, ion implantation with P-type impurities in the gate electrode hardly changes the work functions of the nickel silicides. Thus, the flat band voltage cannot be controlled in a P-type MOS transistor that has such a gate electrode.

As a solution to this, the following method has been proposed: when a gate electrode is made of nickel silicides, the work functions of nickel silicides are controlled by composing the gate electrode from nickel silicides that have different kinds of silicide phases without ion implantation with P-type impurities. More specifically, the proposed gate electrode contains $Ni_3Si_2$, $Ni_2Si$, $Ni_{31}Si_{12}$, $Ni_3Si$, and so forth at different composition ratios relative to that of monovalent nickel silicide (NiSi). This is because the work functions of $Ni_3Si_2$, $Ni_2Si$, $Ni_{31}Si_{12}$, $Ni_3Si$, and other polyvalent nickel silicides are closer to that of nickel (Ni) than that of monovalent nickel silicide (NiSi). For this reason, different composition ratios of polyvalent nickel silicides to monovalent nickel silicide (NiSi) allows for the control of the flat band voltage of a P-type MOS transistor.

In an ordinary method for manufacturing a P-type MOS transistor, however, nickel silicides composing the gate electrode is formed via a reaction between polysilicon (P—Si) and nickel (Ni), and thus polyvalent nickel silicides (e.g., $Ni_3Si$) are formed only near the surface of the gate electrode. This is because the diffusion range of nickel (Ni) is probably limited to the vicinity of the surface in ordinary polysilicon (P—Si).

An example solution that can increase the composition ratios of polyvalent nickel silicides (e.g., $Ni_3Si$) in the gate electrode of a P-type MOS transistor is the manufacturing method proposed in Patent Document 1 (Japanese Laid-open Patent Publication No. 2005-294799). According to the description seen in Patent Document 1, the gate electrode of a P-type MOS transistor is formed of polysilicon, portions excluding the gate electrode are masked with a resist, and then polysilicon recedes after reactive-ion etching; after that, nickel (Ni) is deposited on the gate electrode, and then nickel and polysilicon composing the gate electrode are allowed to react with each other by annealing at an appropriate temperature, thereby yielding nickel silicides. In this case, the material layer constituting the gate electrode is thin; thus, the gate electrode is composed of materials rich in polyvalent nickel silicides (e.g., $Ni_3Si$) even though the polyvalent nickel silicides (e.g., $Ni_3Si$) are formed only near the surface of the gate electrode.

In the method for manufacturing a P-type MOS transistor described above, however, it is difficult to change the composition ratios of the polyvalent nickel silicides contained in the portions of the gate electrode materials located near the boundary between the gate electrode and a gate insulating film. This is because such an operation requires precise control of the thickness of the material layer constituting the gate electrode. This means that the work functions of materials constituting the gate electrode are difficult to control. Furthermore, manufacturing processes of CMOS-type semiconductor apparatuses include the step described above only for P-type MOS transistors and thus cannot be simplified.

SUMMARY

According to an aspect of the embodiments, the method for manufacturing a P-type MOS transistor includes forming a gate insulating film on the substrate, forming a gate electrode from amorphous silicon containing no impurities on the gate insulating film, performing a heat treatment for controlling the film characteristics of the amorphous silicon, depositing a nickel (Ni) layer on the gate electrode, and forming nickel silicides from the gate electrode and the nickel (Ni).

According to other aspect of the embodiments, the method for manufacturing a CMOS-type semiconductor apparatus includes forming a gate insulating film on a substrate that has a P-type MOS transistor formation region and an N-type MOS transistor formation region, forming a first gate electrode for a P-type MOS transistor from amorphous silicon on the gate insulating film over the P-type MOS transistor formation region and a dummy gate electrode for an N-type MOS transistor on the gate insulating film over the N-type MOS transistor formation region, forming side walls on both sides of the first gate electrode and on both sides of the dummy gate electrode in such a manner that the side walls surround the first gate electrode and the dummy gate electrode, performing a heat treatment for controlling the film characteristics of the amorphous silicon, removing the dummy gate electrode, forming a second gate electrode by embedding amorphous silicon in the gap between the side walls that have been formed so as to surround the dummy gate electrode, depositing nickel (Ni) on the first and second gate electrodes, and forming nickel silicides from the first gate electrode and the nickel (Ni) and from the second gate electrode and the nickel (Ni).

According to other aspect of the embodiments, the CMOS-type semiconductor apparatus containing a substrate that has a P-type MOS transistor formation region taking on N-type and an N-type MOS transistor formation region taking on N-type includes a gate insulating film formed on the surface of the substrate, a P-type MOS transistor that is formed on the gate insulating film over the P-type MOS transistor formation region and has a first gate electrode composed of nickel silicides containing different kinds of silicide phases, and an N-type MOS transistor that is formed on the gate insulating film over the N-type MOS transistor formation region and has a second gate electrode composed of nickel silicides whose main ingredient is nickel monosilicide (NiSi).

The object and advantages of the embodiments will be realized and attained by means of the elements and combinations particularly pointed out in the claims.

It is to be understood that both the foregoing general description and the following detailed description and are exemplary and explanatory and are not restrictive of the embodiments, as claimed.

BRIEF DESCRIPTION OF THE DRAWINGS

FIGS. 1A to 1L are cross-sectional diagrams each showing a part of a manufacturing process of a P-type MOS transistor according to the first embodiment.

DESCRIPTION OF THE PREFERRED EMBODIMENTS

Hereinafter, explanations are given to describe the first embodiment, the second embodiment, and the third embodiment, which are for a P-type MOS transistor, a semiconductor apparatus having a P-type MOS transistor and an N-type MOS transistor, and a method for manufacturing a semiconductor apparatus.

Description of First Embodiment

The first embodiment is described in detail with reference to FIGS. 1A to 1L, FIG. 2, and FIG. 3.

A manufacturing process of a P-type MOS transistor according to the first embodiment, which includes a heat treatment step for controlling the film characteristics of amorphous silicon, is a method for manufacturing a P-type MOS transistor whose gate electrode is composed of nickel silicides formed via a reaction between the amorphous silicon and nickel (Ni) after the heat treatment step. This manufacturing method allows for the control of the composition ratios of polyvalent nickel silicides contained in the material of the gate electrode, thereby making it possible to control the flat band voltage of a capacitor, which is constituted by the gate electrode, gate insulating film, and substrate of the P-type MOS transistor.

<Manufacturing Process of a P-Type MOS Transistor According to the First Embodiment>

FIGS. 1A to 1L are cross-sectional diagrams for major components each showing a part of a manufacturing process of a P-type MOS transistor according to the first embodiment.

Figure 1B:
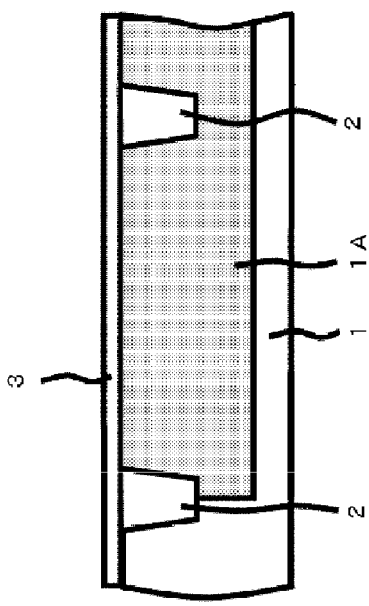
Figure 1D:
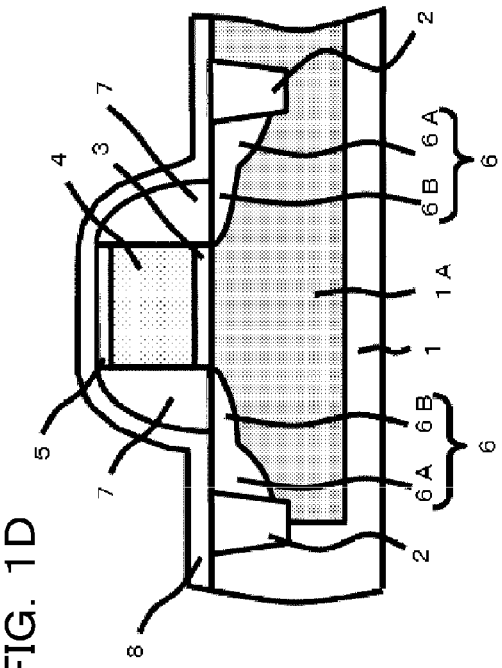
Figure 1A:
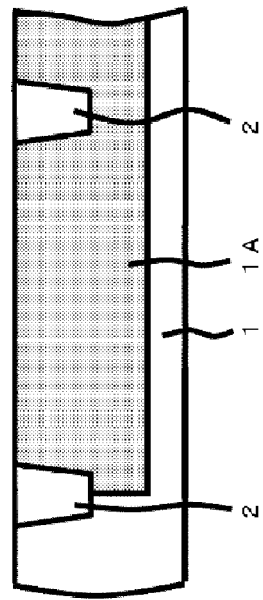

As shown in FIG. 1A, a silicon substrate 1 is ion-implanted with N-type impurities and then annealed so that the silicon substrate 1 is prepared to have an N-type region 1A. Then, device separators 2 for partitioning devices are formed on the N-type region 1A of the silicon substrate 1 by, for example, LOCOS (Local Oxidation of Silicon) or STI (Shallow Trench Isolation). A silicon substrate 1 taking on N-type conductivity may be used instead.

As shown in FIG. 1B, the entire surface of the silicon substrate 1, which has the device separators 2 formed therein, is covered with a gate insulating film 3 made of a highly dielectric insulating film (a high-K film) that is an insulating hafnium (Hf) oxide having a higher dielectric constant than silicon oxide ($SiO_2$). This gate insulating film 3 has a thickness of approximately 3.5 nm after being formed by, for example, CVD. The gate insulating film 3 used in this embodiment is composed of, for example, nitrogen-containing hafnium silicate (HfSiON) or hafnium silicate (HfSiO); however, the gate insulating film 3 may be an ordinary silicon oxide film ($SiO_2$).

Figure 1C:
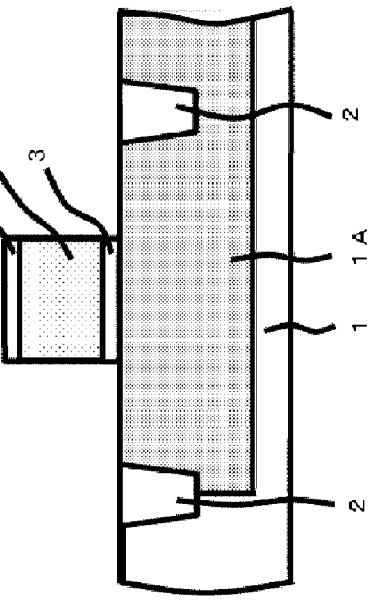

FIG. 1C is a cross-sectional diagram for major components showing a dummy gate electrode formation step. Note that the gate electrode formation step according to this embodiment consists of a step of forming a dummy gate electrode 4, a step of removing the dummy gate electrode 4, and a step of forming an amorphous-silicon-based gate electrode 12 in the site from which the dummy gate electrode 4 has been removed. However, the gate electrode formation step excludes a source/drain region formation step, which comes between the step of forming a dummy gate electrode 4 and the step of removing the dummy gate electrode 4.

As shown in FIG. 1C, the material for forming the dummy gate electrode 4, polysilicon, is deposited on the gate insulating film 3 until the thickness thereof reaches approximately 100 nm by means of, for example, CVD (Chemical Vapor Deposition), and then the material for forming an insulating film 5, for example, silicon oxide ($SiO_2$) or a silicon nitride film (SiN), is formed on the material for forming the dummy gate electrode 4, polysilicon. Then, lithography and anisotropic etching, such as RIE (Reactive Ion Etching), are performed to shape the insulating film 5, polysilicon, and gate insulating film 3 into the pattern of a gate electrode on the N-type region 1A of the silicon substrate 1. This anisotropic etching treatment shapes polysilicon into the pattern of the dummy gate electrode 4.

As shown in FIG. 1D, the insulating film 5 acts as a mask, while the N-type region 1A of the silicon substrate 1 is ion-implanted with P-type impurities, such as B ions. The acceleration energy is in the range of 1 to 5 keV, and the amount introduced is in the range of 5 to $10 \times 10^{14}$ [$cm^{-2}$]. Then, annealing is performed in a nitrogen atmosphere at a temperature equal to or higher than 500° C., for example, 1000° C., for 0 to 10 seconds, so that extension regions 6B are formed beneath both sides of the dummy gate electrode 4. The maximum depth of the extension regions 6B is approximately 5 nm. Then, the entire surface of the device formation region is covered with, for example, a silicon nitride (SiN) film or a silicon oxide ($SiO_2$) film by means of, for example, CVD. Then, side walls 7 are formed on the sides of the laminated gate insulating film 3, dummy gate electrode 4, and insulating film 5 by means of anisotropic etching, such as RIE.

Subsequently, the insulating film 5 and the side walls 7 act as masks, while both sides of the dummy gate electrode 4, which has been formed on the silicon substrate 1, are ion-implanted with P-type impurities, such as B ions. The acceleration energy is in the range of 5 to 10 keV, and the amount introduced is in the range of 4 to $8\times10^{15}$ [$cm^{-2}$]. Then, annealing is performed in a nitrogen atmosphere at a temperature equal to or higher than 500° C., for example, 1000° C., for 0 to 10 seconds, so that P-type impurities diffusion regions 6A are formed along the extension regions 6B located near the side walls 7. The maximum depth of the P-type impurities diffusion regions 6A is approximately 20 nm. Then, heat-resistant metal film 8 made of, for example, cobalt (Co) or nickel (Ni) is deposited on the entire surface by means of, for example, CVD or sputtering.

Figure 1E:
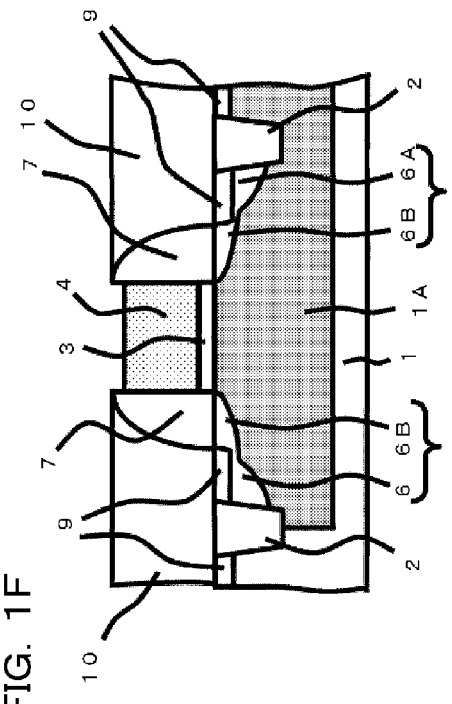

As shown in FIG. 1E, the metal film 8 deposited on the entire surface and the P-type impurities diffusion regions 6A are allowed to react with each other by a heat treatment at approximately 1000° C. for 10 seconds, and then silicide electrodes 9 composed of a cobalt silicide or a nickel silicide are formed on the P-type impurities diffusion regions 6A. The thickness of the silicide electrodes 9 is on the order of 10 to 20 nm. Then, unreacted portions of the metal film, which are not shown in the drawing, are removed by, for example, a treatment with an agent such as a mixture of sulfuric acid and oxydol. Note that the top and sides of the dummy electrode 4 are covered with the insulating film 5 and side walls 7, and thus the dummy electrode 4 is not silicidated.

Figure 1F:
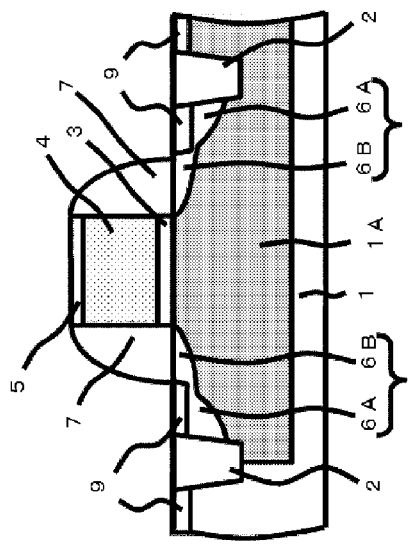

As shown in FIG. 1F, an interlayer insulating film 10 is formed from silicon nitride (SiN) or silicon oxide ($SiO_2$) on the entire surface by CVD. This interlayer insulating film 10 is desirably thicker than the dummy gate electrode 4 but thinner than the total thickness of the dummy gate electrode 4 and the insulating film 5. Then, CMP (Chemical Mechanical Polishing) is performed on the interlayer insulating film 10 in such a manner that the insulating film 5 stays in part on the dummy gate electrode 4. Then, the portions of the insulating film 5 left on the dummy gate electrode 4 are removed using diluted hydrofluoric acid (HF) or the like.

Figure 1G:
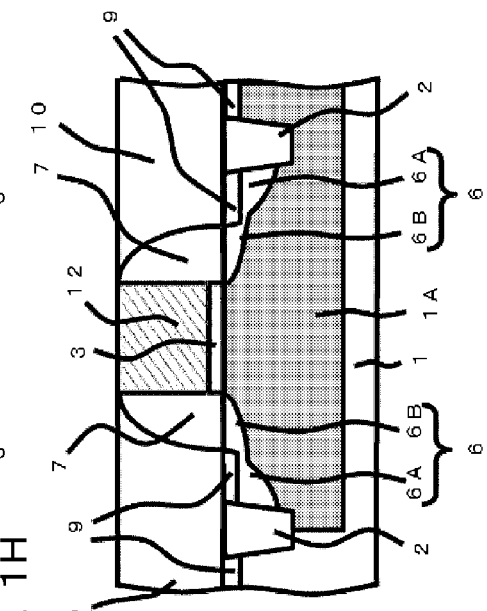

As shown in FIG. 1G, wet etching is performed using an organic alkali solution, such as TMAH (Tetra Methyl Ammonium Hydroxide), in order that the dummy gate electrode 4 is selectively removed with the side walls 7 and the interlayer insulating film 10 left.

Figure 1H:
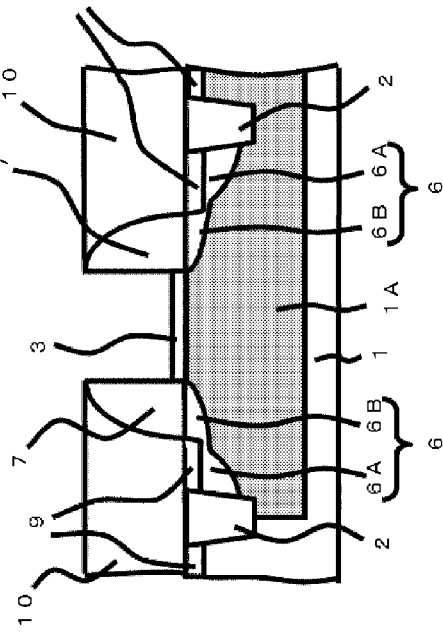

As shown in FIG. 1H, an amorphous silicon layer is formed on the entire surface by CVD under reduced pressure at a temperature in the range of 520 to 540° C. with silane ($SiH_4$) 20%/helium (He) 80% used as a dilution gas.

Note that deposition of amorphous silicon under these conditions results in a maximum decrease in the amount of conductive impurities contained in the amorphous silicon. This is because helium (He) protects the amorphous silicon from contamination by conductive impurities existing in the silane ($SiH_4$) gas.

In the first embodiment, therefore, the content of such conductive impurities is desirably equal to or less than $1\times10^{18}$ [$cm^{-3}$].

When the amount of conductive impurities is as low as described above, the nickel silicides described later, which have different kinds of silicide phases, have their inherent work functions because the work functions can be easily controlled by adjusting the composition ratios of polyvalent nickel silicides (e.g., $Ni_3Si$) under such a circumstance. As a result, the threshold accuracy of the resultant P-type MOS transistor, which corresponds to the composition ratios of polyvalent nickel silicides contained in the material composing the gate electrode, is improved.

While the laminate of amorphous silicon is being formed, amorphous silicon is embedded in the gap between the side walls 7, which have been formed around the dummy gate electrode 4. Then, the portions of amorphous silicon lying on the interlayer insulating film 10 are removed by CMP until the side walls 7 and the interlayer insulating film 10 are exposed. In this way, an amorphous-silicon-based gate electrode 12 is formed.

The reason why amorphous silicon is used to form the gate electrode 12 is as follows: amorphous silicon has film characteristics (e.g., degree of crystallization of silicon) that can be more easily controlled by the heat treatment described later than those of polysilicon and thus is advantageous in forming nickel silicides composed of different kinds of silicide phases rich in polyvalent nickel silicides (e.g., $Ni_3Si$).

As shown in FIG. 1I, the amorphous-silicon-based gate electrode 12 is subjected to a heat treatment. The kind of heat treatment may be either or both of the following two steps.

One of the heat treatment steps is a step of irradiating the amorphous silicon composing the gate electrode 12 with laser until the amorphous-silicon-based gate electrode 12 is melted in order that the film characteristics of the amorphous silicon are controlled. The laser output is, for example, in the range of 1000 to 1800 [$mJ/cm^2$]. Another one of the heat treatment steps is a step of performing RTA (Rapid Thermal Annealing) until the amorphous-silicon-based gate electrode 12 is melted in order that the film characteristics of the amorphous silicon are controlled. The conditions under which RTA is performed include, for example, a temperature of approximately 1000° C. and a period of time of 10 seconds. Either of both of these steps gives controlled film characteristics of the amorphous silicon composing the gate electrode 12, such as the degree of crystallization of silicon. In addition, the degree of crystallization includes the size and degree of orientation of crystal grains reached after polycrystalline amorphous silicon is obtained by heat treatment.

As shown in FIG. 1J, a nickel (Ni) film 13 is deposited on the entire surface, which includes the gate electrode 12, by means of, for example, CVD or sputtering until the thickness thereof reaches a value in the range of 40 to 80 nm.

As shown in FIG. 1K, RTA is performed for 60 seconds at a temperature of 400° C. so that the amorphous silicon and the nickel (Ni) 13 react with each other. In this way, a nickel-silicide-based gate electrode 14 is formed.

As shown in FIG. 1L, the formed nickel-silicide-based gate electrode 14 is immersed in a sulfuric-acid-containing solution, such as a mixture of sulfuric acid ($H_2SO_4$) and oxydol ($H_2O_2$), in order that unreacted portions of the nickel (Ni) 13 remaining on the top of the gate electrode 14 are removed.

After the subsequent steps of shaping the interlayer insulating film, contacts, and wiring, a device equipped with the P-type MOS transistor according to this embodiment is completed.

<Advantages of the P-Type MOS Transistor According to the First Embodiment>

Figure 2:
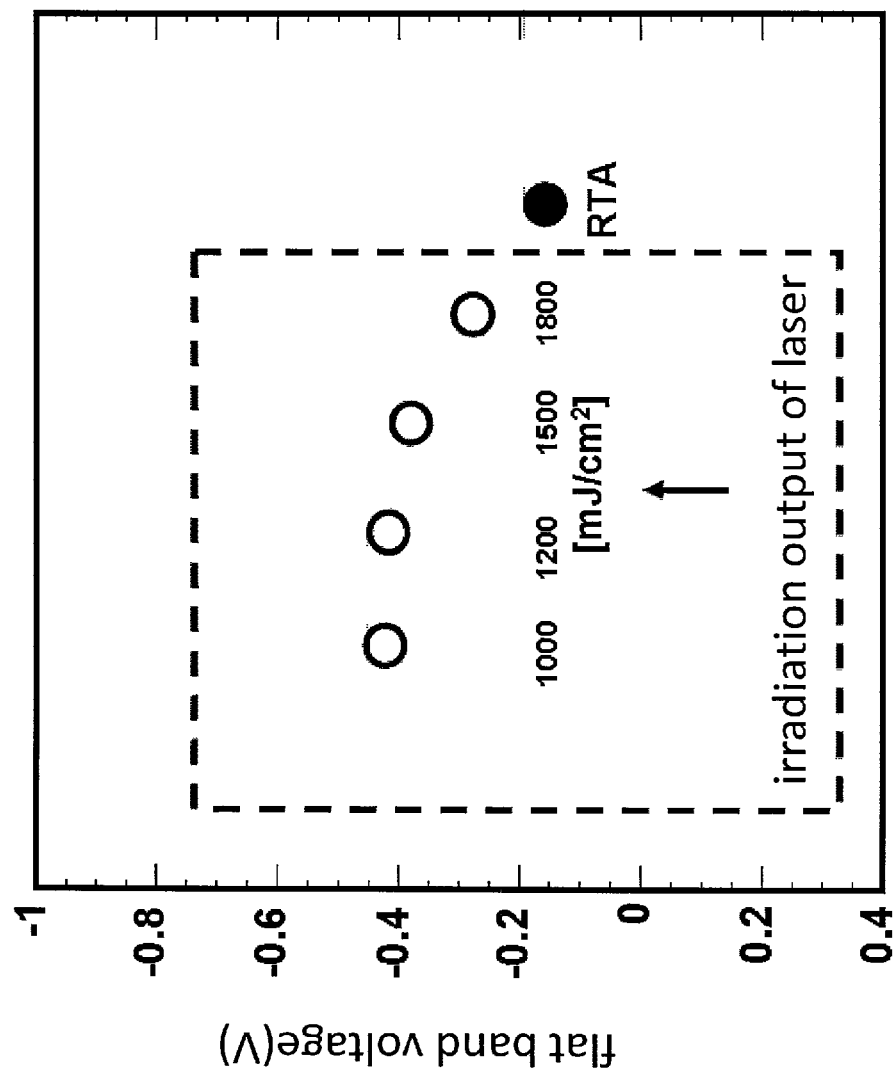
FIG. 2 is a diagram showing the change in flat band voltage obtained for P-type MOS transistors according to the first embodiment, which each have a gate electrode composed of nickel silicides formed via a reaction between amorphous silicon heated by irradiation with laser or RTA and nickel (Ni).

FIG. 2 is a diagram showing the change in flat band voltage obtained for P-type MOS transistors according to the first embodiment, which each have a gate electrode composed of nickel silicides formed via a reaction between amorphous silicon heated by irradiation with laser or RTA and nickel (Ni).

FIG. 2 shows the change in flat band voltage obtained for P-type MOS transistors that each have a gate electrode composed of nickel silicides formed via a reaction between amorphous silicon heated by irradiation with laser or RTA and nickel (Ni). The horizontal axis of FIG. 2 represents conditions under which amorphous silicon composing a gate electrode was heated by irradiation with laser or RTA. For example, "1000 [mJ/cm$^2$]" seen in FIG. 2 represents the irradiation output of laser. The irradiation output of laser applied to the amorphous silicon composing a gate electrode was 1000 [mJ/cm$^2$], 1200 [mJ/cm$^2$], 1500 [mJ/cm$^2$], or 1800 [mJ/cm$^2$]. As for the P-type MOS transistors obtained after heating by irradiation with laser, the flat band voltages at the individual irradiation outputs are represented by open circles enclosed with broken lines. The conditions under which RTA was performed included a temperature of approximately 1000° C. and a period of time of 10 seconds. As for the P-type MOS transistor obtained after heating by RTA, the flat band voltage is represented by a filled circle.

As clearly seen in FIG. 2, the flat band voltages of the P-type MOS transistors obtained after heating by irradiation with laser at different irradiation outputs range from −0.43 [V] to −0.28 [V], namely, exhibit some positive change, with increase in the irradiation output of laser from 1000 [mJ/cm$^2$] to 1800 [mJ/cm$^2$]. On the other hand, the flat band voltage of the P-type MOS transistor obtained after heating by RTA is −0.16 [V]. FIG. 2 suggests that the flat band voltage of the P-type MOS transistor whose amorphous silicon is heated by RTA is higher than those of the P-type MOS transistors whose amorphous silicon is heated by irradiation with laser. In other words, a treatment with more intense heat results in a higher flat band voltage of a P-type MOS transistor that has a gate electrode composed of nickel silicides formed via a reaction between amorphous silicon and nickel (Ni) with the film characteristics of the silicon controlled by the heat treatment.

Figure 3:
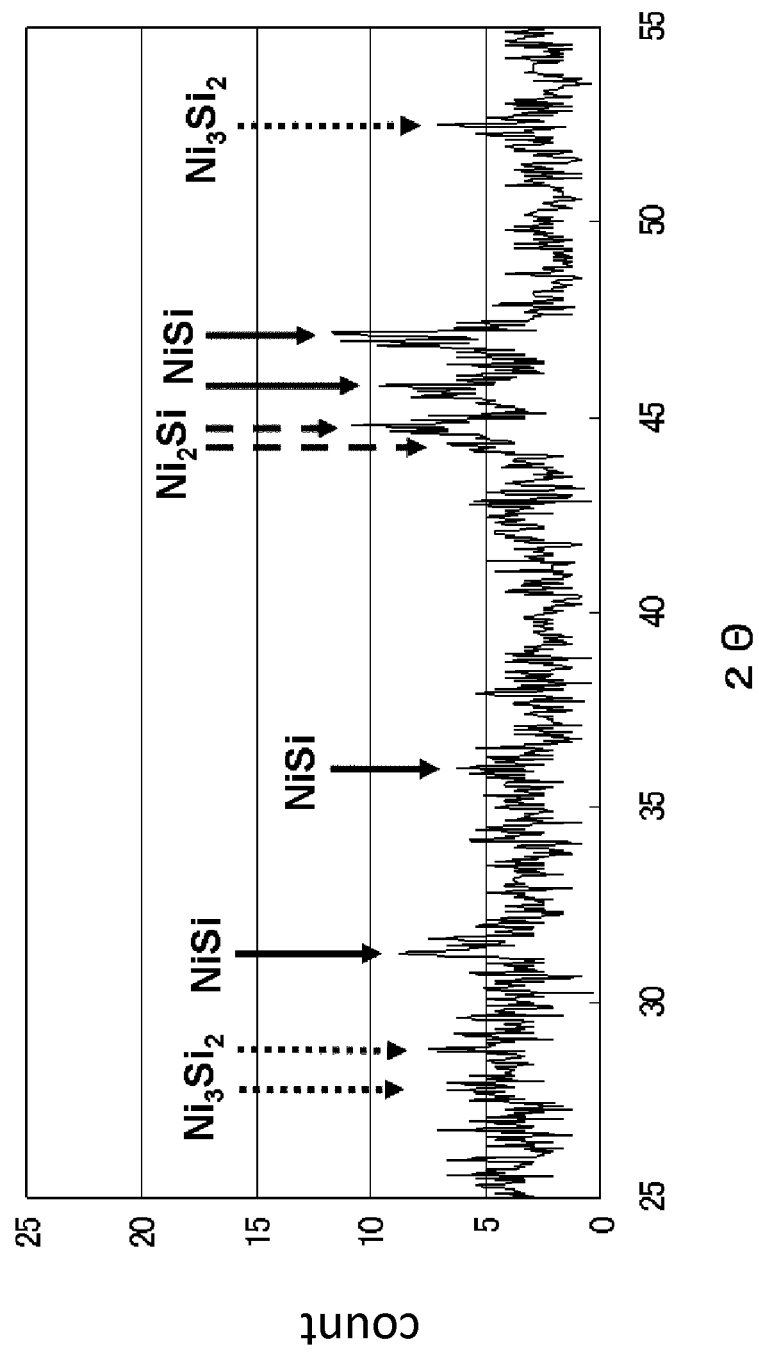
FIG. 3 is a diagram showing an X-ray diffraction pattern obtained for nickel silicides composing the gate electrode according to the first embodiment shown in FIG. 1L.

FIG. 3 is a diagram showing an X-ray diffraction pattern obtained for nickel silicides composing a gate electrode according to the first embodiment shown in FIG. 1L.

XRD (X-Ray Diffraction) was used to analyze the composition of nickel silicides formed via a reaction between amorphous silicon heated by RTA and nickel (Ni). Note that the parameter of the horizontal axis, θ, represents the direction of diffraction by X-rays observed on irradiation of nickel silicides with X-rays, whereas the vertical axis represents the number of counts measured by an X-ray detector, namely, the detected intensity of X-rays at individual θ. Comparisons between an X-ray diffraction pattern based on XRD and those obtained for polyvalent nickel silicides (e.g., Ni$_3$Si) provide identifications of the nickel silicides composing the gate electrode.

As clearly seen in FIG. 3, nickel silicides formed via a reaction between amorphous silicon heated by RTA and nickel (Ni) contain Ni$_3$Si$_2$, Ni$_2$Si, and NiSi, thereby suggesting the presence of different kinds of mixed silicide phases. Therefore, a gate electrode formed by the steps according to the first embodiment would probably contain polyvalent nickel silicide phases in the material thereof.

FIG. 3 tells that the control of the film characteristics of amorphous silicon by heating allows the resultant nickel silicides, which compose a gate electrode, to contain different kinds of silicide phases. In other words, the composition ratios of polyvalent nickel silicides (e.g., Ni$_3$Si) would be improved in nickel silicides composing a gate electrode.

Incidentally, the work functions of polyvalent nickel silicides (e.g., Ni$_3$Si) are close to that of nickel (Ni). Thus, higher contents of polyvalent nickel silicides (e.g., Ni$_3$Si) in nickel silicides composing a gate electrode according to the first embodiment would probably result in a positive shift of the flat band voltage of a capacitor constituted by the gate electrode, gate insulating film, and substrate of a P-type MOS transistor. According to FIG. 2, irradiation of amorphous silicon with laser with an intense energy or a heat treatment of amorphous silicon based not on irradiation with laser but on RTA results in a positive shift of the flat band voltage described above. In a method for manufacturing a P-type MOS transistor according to the first embodiment, therefore, heat treatment conditions can be adjusted to control the composition ratios of polyvalent nickel silicides (e.g., Ni$_3$Si) in nickel silicides composing the gate electrode.

Consequently, the heat-driven control of the film characteristics of amorphous silicon results in controlled work functions of nickel silicides formed via a reaction between the amorphous silicon and nickel (Ni), namely, controlled work functions of all the nickel silicides composing a gate electrode. In a P-type MOS transistor, this leads to a controlled flat band voltage of a capacitor constituted by the gate electrode, a gate insulating film, and a silicon substrate. Therefore, the threshold of a P-type MOS transistor can probably be controlled by adjusting the film characteristics of amorphous silicon composing the gate electrode.

The method for manufacturing the P-type MOS transistor according to the first embodiment includes a gate insulating film formation step for forming a gate insulating film on a substrate, a step of forming a gate electrode from amorphous silicon on the gate insulating film, a control-by-heating step for controlling the film characteristics of the amorphous silicon, a subsequent step of depositing a nickel (Ni) layer on the gate electrode, and a silicide formation step for forming nickel silicides from the gate electrode and the nickel (Ni). Note that the gate insulating film may be a silicon oxide film or a highly dielectric film.

The manufacturing method described above includes a heat treatment step for controlling the film characteristics of amorphous silicon, allowing for the formation of nickel silicides containing polyvalent nickel silicides at controlled mixing ratios. In other words, this manufacturing method provides an easy way to manufacture P-type MOS transistors in which the material of gate electrodes contains polyvalent nickel silicides at controlled mixing ratios. Controlled mixing ratios of polyvalent nickel silicides contained in the material of gate electrodes lead to controlled work functions of all the nickel silicides composing the gate electrodes. In this way, this manufacturing method offers an advantage of controlling thresholds of resultant P-type MOS transistors.

The P-type MOS transistor according to the first embodiment is a P-type MOS transistor constituted by a silicon substrate having an N-type region, a gate insulating film formed from a highly dielectric insulating film on the surface of the substrate, a gate electrode that is formed on the gate insulating film and is composed of nickel silicides containing different kinds of mixed silicide phases, and source/drain electrodes formed on both sides of the gate electrode, wherein the composition ratios of polyvalent nickel silicides contained in the material of the gate electrode are determined in correspondence with the threshold.

The content of conductive impurities in the gate electrode is equal to or less than $1 \times 10^{18}$ [cm$^{-3}$]. The gate insulating film may be a silicon oxide film or a highly dielectric film.

The P-type MOS transistor described above offers the advantage that it exhibits a predetermined threshold despite the fact that it has a gate electrode composed of nickel silicides.

In addition, a content of conductive impurities in the gate electrode of $1 \times 10^{18}$ [cm$^{-3}$] or less leads to an improved accuracy of the threshold, which corresponds to the composition ratios of polyvalent nickel silicides.

Description of Second Embodiment

The second embodiment is described in detail with reference to FIGS. 4A to 4N, FIG. 5, and FIG. 6. While the first embodiment relates to a P-type MOS transistor, the second embodiment relates to a CMOS-type semiconductor apparatus. Note that a CMOS-type semiconductor apparatus according to the second embodiment contains a P-type MOS transistor that has a first gate electrode obtained after a step of controlling the film characteristics of amorphous silicon by heating with laser followed by forming nickel silicides from the amorphous silicon.

The first gate electrode of the resultant P-type MOS transistor is composed of polyvalent nickel silicides (e.g., Ni$_3$Si), and thus a greater difference in flat band voltage occurs between the capacitor relating to the first gate electrode of the P-type MOS transistor and that of the capacitor relating to a second gate electrode of an N-type MOS transistor.

<Manufacturing Process of the CMOS-Type Semiconductor Apparatus According to the Second Embodiment>

Figure 4A:
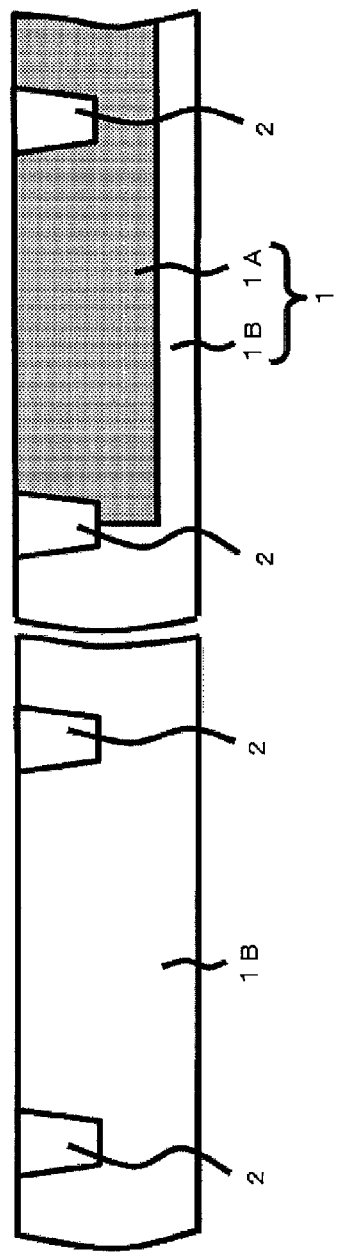
FIGS. 4A to 4N are cross-sectional diagrams each showing a part of a manufacturing process of a CMOS-type semiconductor apparatus according to the second embodiment.
Figure 4B:
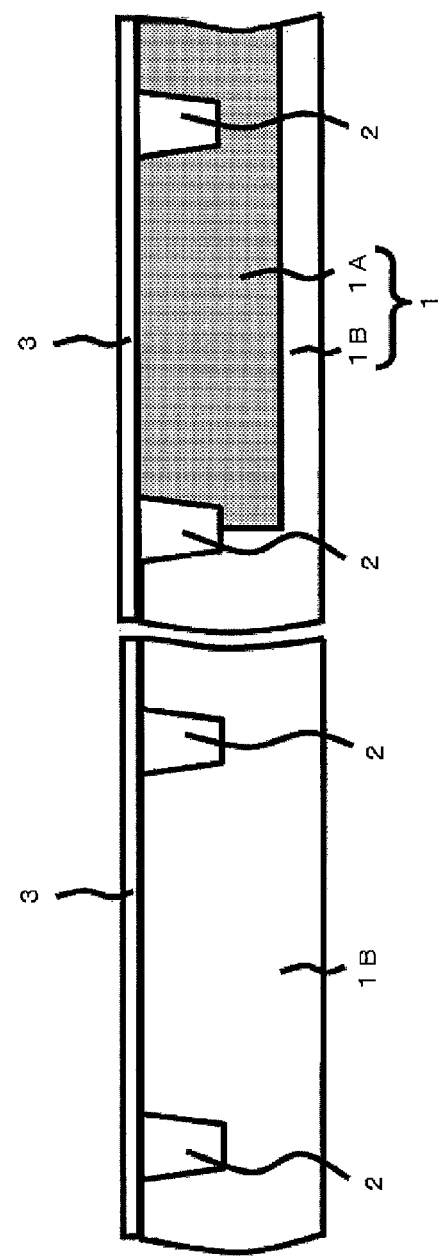
Figure 4C:
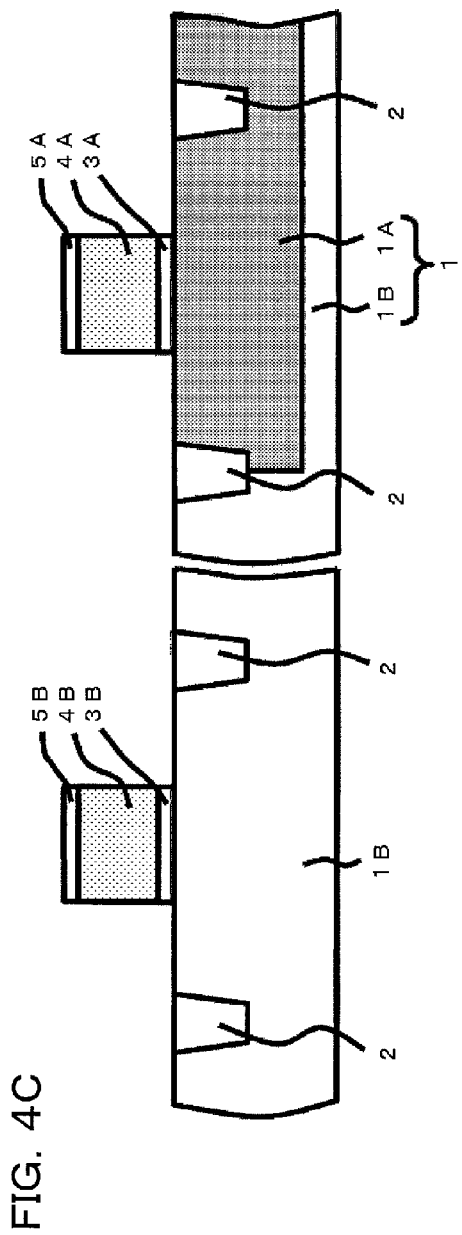
Figure 4D:
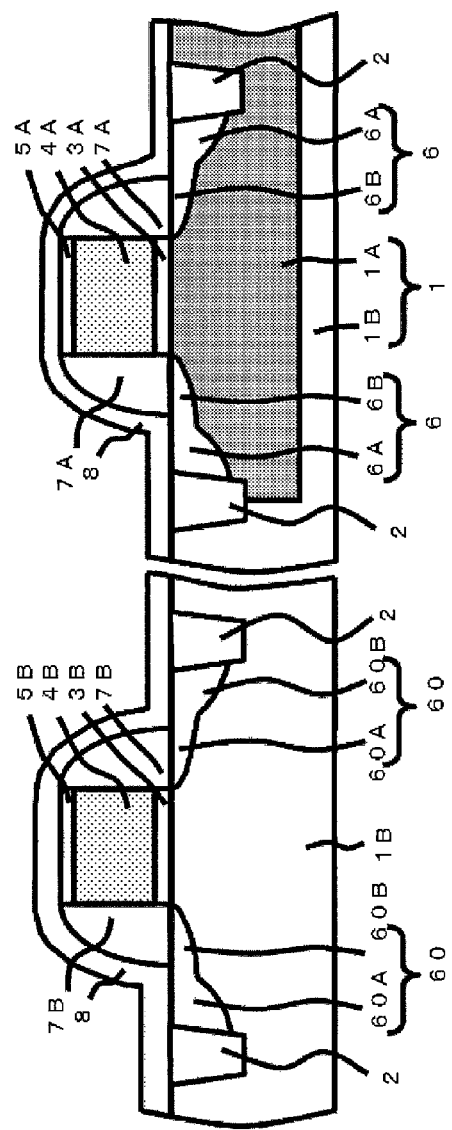
Figure 4E:
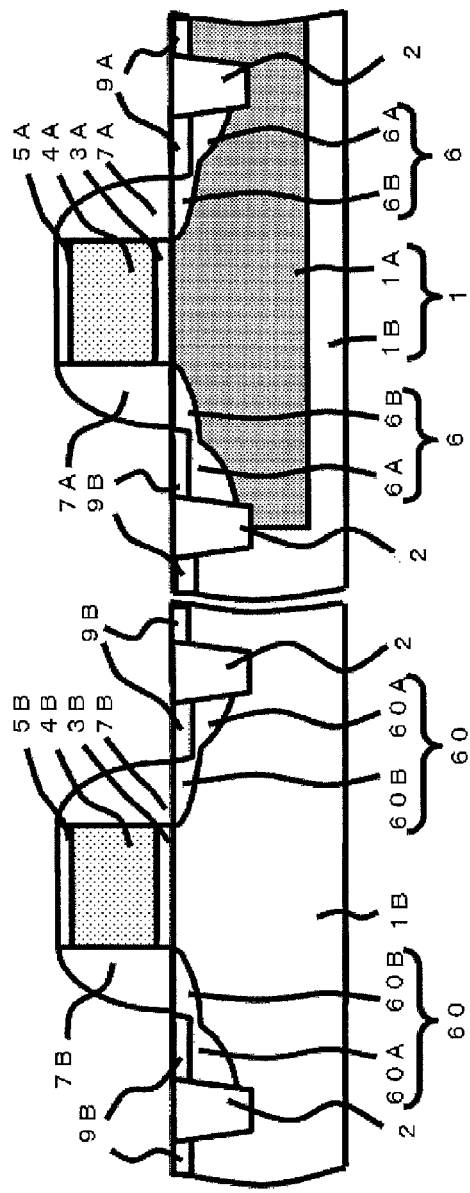
Figure 4F:
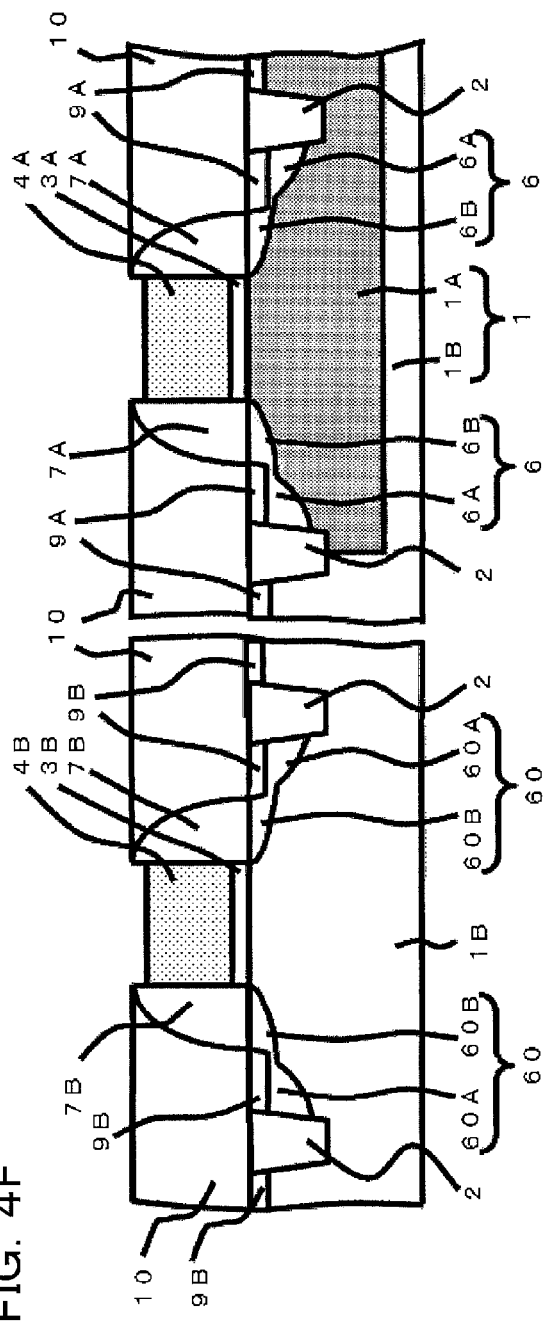
Figure 4G:
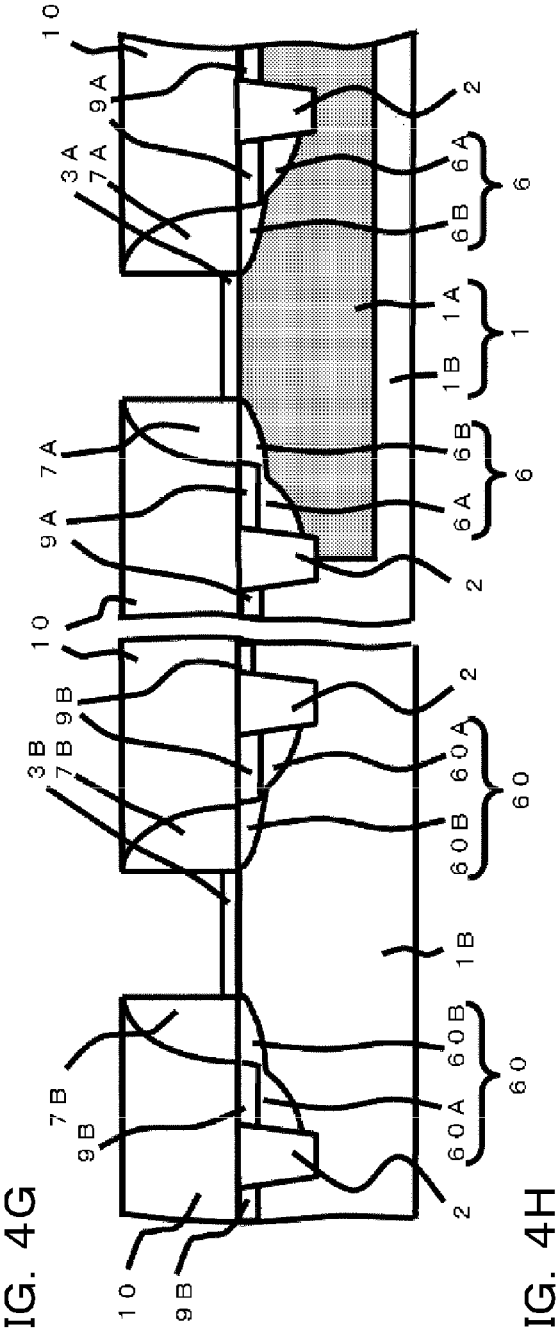
Figure 4H:
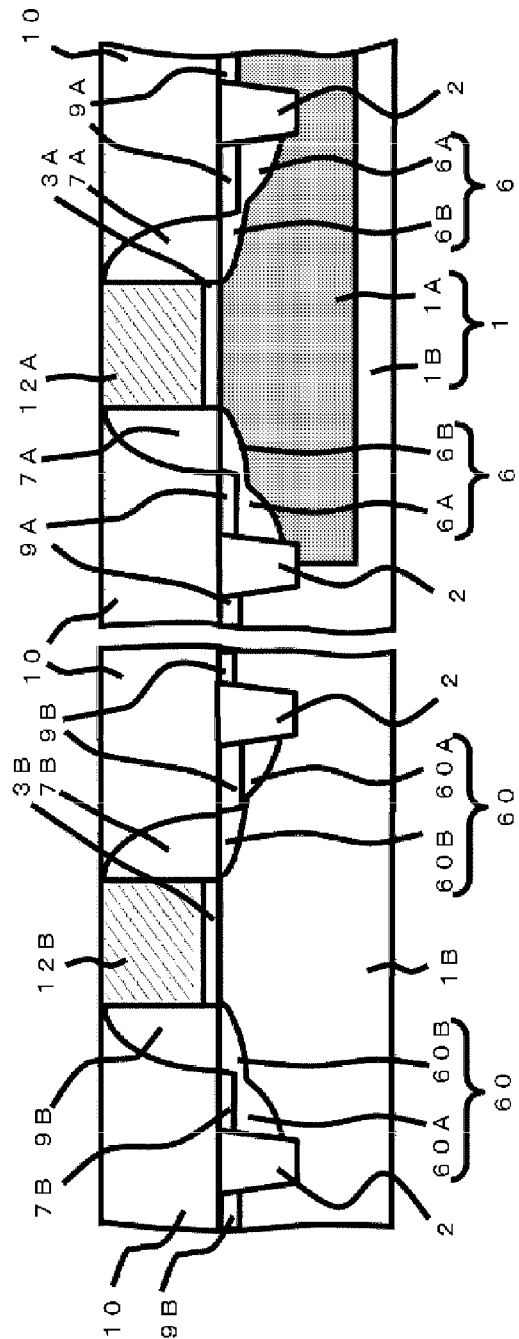
Figure 4I:
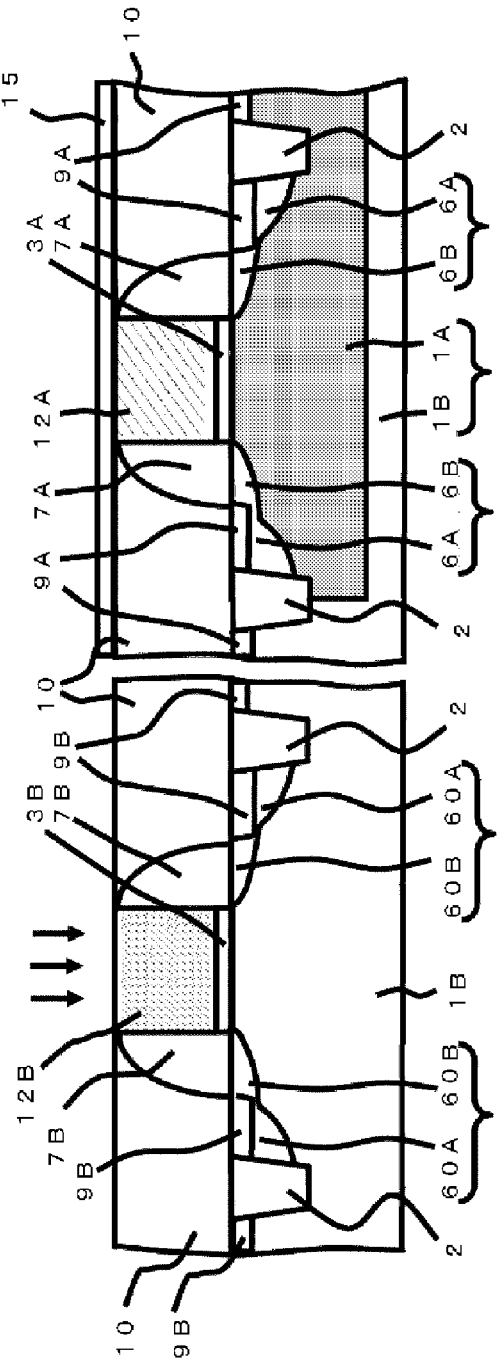
Figure 4J:
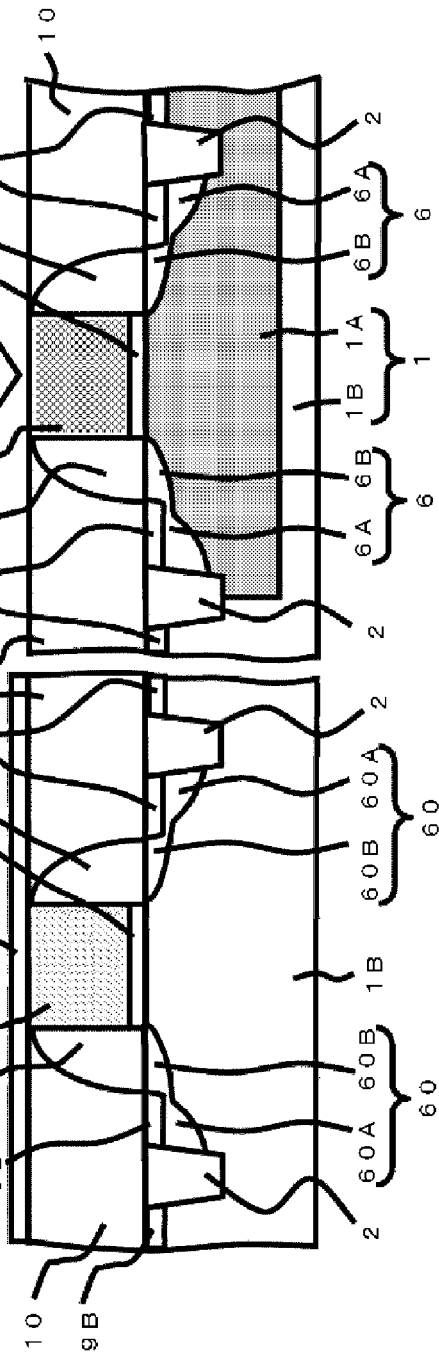
Figures 4K, 4L:
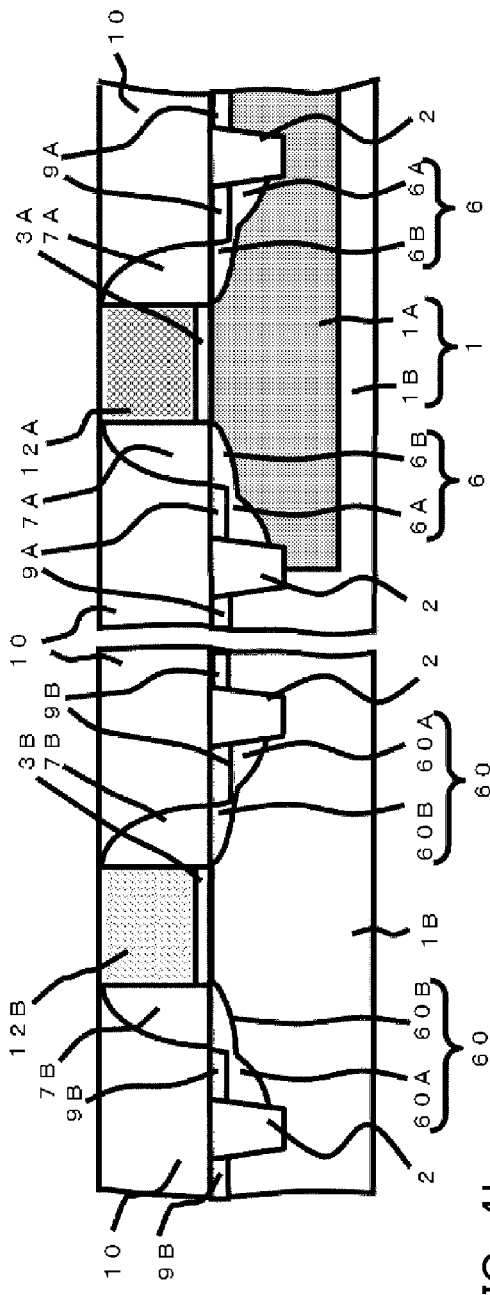
Figure 4M:
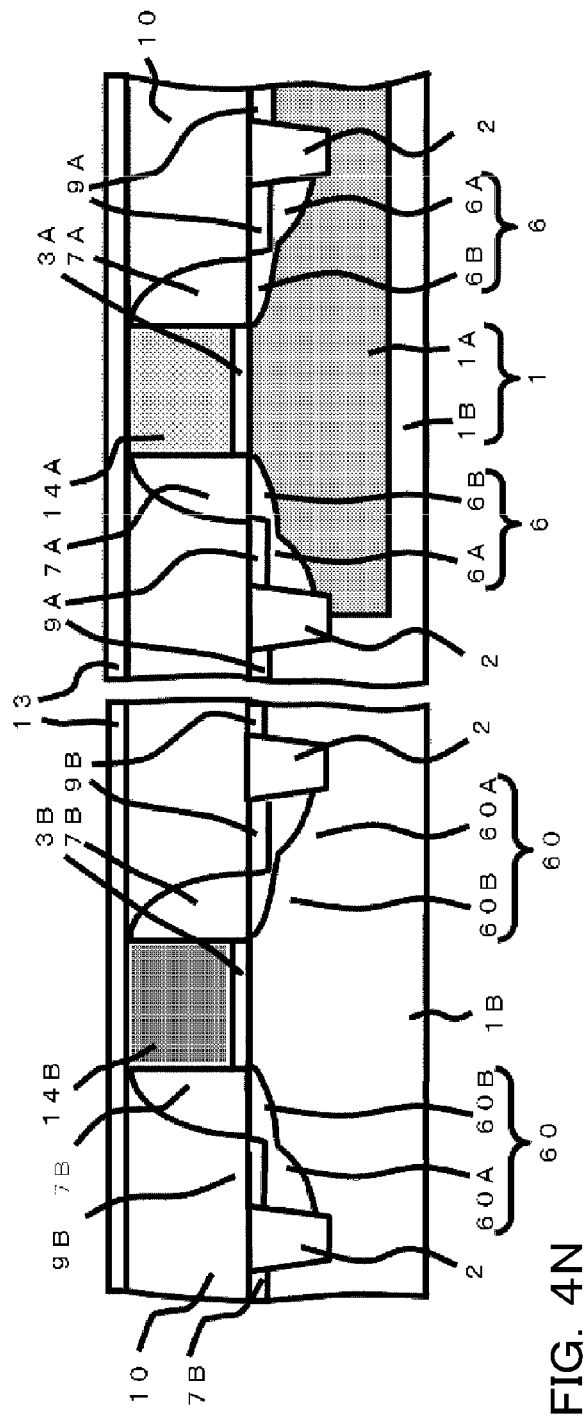
Figure 4N:
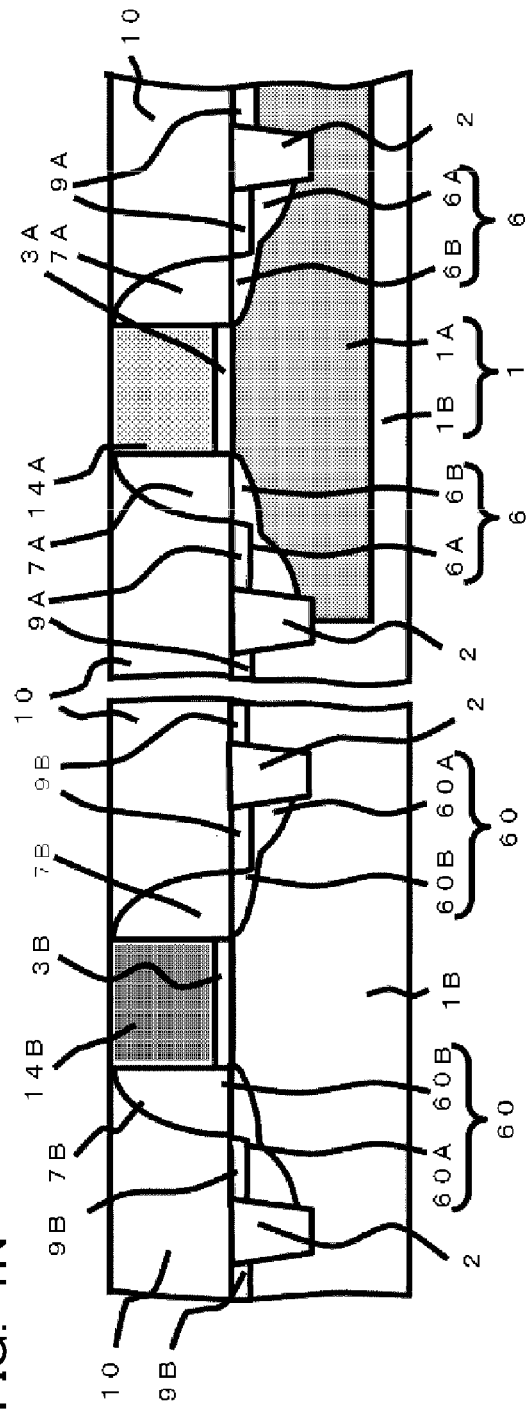

FIGS. 4A to 4N are cross-sectional diagrams each showing a part of a manufacturing process of a CMOS-type semiconductor apparatus according to the second embodiment.

As shown in FIG. 4A, the P-type MOS transistor formation region 1A of a P-type silicon substrate 1 is ion-implanted with N-type impurities, and then the silicon substrate 1 is annealed so that the silicon substrate 1 is prepared to have a P-type MOS transistor formation region 1A and an N-type MOS transistor formation region 1B. Then, device separators 2 for partitioning devices are formed on the P-type MOS transistor formation region 1A and the N-type MOS transistor formation region 1B of the silicon substrate 1 by, for example, LOCOS or STI.

As shown in FIG. 4B, the entire surface of the silicon substrate 1, which has the device separators 2 formed therein, is covered with a gate insulating film 3 made of a highly dielectric insulating film (a high-K film) that is an insulating hafnium (Hf) oxide having a higher dielectric constant than silicon oxide (SiO$_2$). This gate insulating film 3 has a thickness of approximately 3.5 nm after being formed by, for example, CVD. The gate insulating film 3 used in this embodiment is composed of, for example, nitrogen-containing hafnium silicate (HfSiON) or hafnium silicate (HfSiO); however, the gate insulating film 3 may be an ordinary silicon oxide film (SiO$_2$).

FIGS. 4C and 4D are cross-sectional diagrams each showing a part of the manufacturing process of a CMOS-type semiconductor apparatus according to the second embodiment.

FIG. 4C is a cross-sectional diagram for major components showing a dummy gate electrode formation step. Note that the gate electrode formation step according to this embodiment consists of a step of forming dummy gate electrodes 4A and 4B, a step of removing the dummy gate electrodes 4A and 4B, and a step of forming amorphous-silicon-based gate electrodes 12A and 12B in the site from which the dummy gate electrodes 4A and 4B have been removed. However, the gate electrode formation step excludes a source/drain region formation step, which comes between the step of forming dummy gate electrodes 4A and 4B and the step of removing the dummy gate electrodes 4A and 4B.

As shown in FIG. 4C, the material for forming the dummy gate electrodes 4A and 4B, polysilicon, is deposited on the gate insulating film 3 until the thickness thereof reaches approximately 100 nm by means of, for example, CVD (Chemical Vapor Deposition), and then the material for forming insulating films 5A and 5B, for example, silicon oxide (SiO$_2$), is formed on the material for forming the dummy gate electrodes 4A and 4B, polysilicon. Then, lithography and anisotropic etching or other techniques are performed to shape the gate insulating film 3, polysilicon, and silicon oxide (SiO$_2$) into the pattern of a gate electrode, which consists of the gate insulating film 3A, dummy gate electrode 4A, and insulating film 5A, on the P-type MOS transistor formation region 1A of the silicon substrate 1. At the same time, the gate insulating film 3, polysilicon, and silicon oxide (SiO$_2$) are shaped into the pattern of a gate electrode, which consists of the gate insulating film 3B, dummy gate electrode 4B, and insulating film 5B, on the N-type MOS transistor formation region 1B taking on P-type. This anisotropic etching treatment shapes polysilicon into the patterns of the dummy gate electrodes 4A and 4B.

FIG. 4D is a cross-sectional schematic diagram for major components showing a step of forming source/drain regions on both sides of each of the dummy gate electrodes 4A and 4B.

As shown in FIG. 4D, a resist mask is formed on the N-type MOS transistor formation region 1B after the structure shown in FIG. 4C is shaped, and then the insulating film 7A acts as a mask, while the P-type MOS transistor formation region 1A of the silicon substrate 1, which takes on N-type, is ion-implanted with P-type impurities, such as B (boron) ions. The acceleration energy is in the range of 1 to 5 keV, and the amount introduced is in the range of 5 to $10 \times 10^{14}$ [cm$^{-2}$]. Then, annealing is performed in a nitrogen atmosphere at a temperature equal to or higher than 500° C., for example, 1000° C., for 0 to 10 seconds, so that extension regions 6B are formed beneath both sides of the dummy gate electrode 4A. The depth of the extension regions 6B is approximately 5 nm.

After that, another resist mask is formed on the P-type MOS transistor formation region 1A, and then the N-type MOS transistor formation region 1B of the silicon substrate 1, which takes on P-type, is ion-implanted with N-type impurities, such as P ions. The acceleration energy is in the range of 5 to 15 keV, and the amount introduced is in the range of 5 to $10 \times 10^{14}$ [cm$^{-2}$]. Then, annealing is performed in a nitrogen atmosphere at a temperature equal to or higher than 500° C., for example, 1000° C., for 0 to 10 seconds, so that extension regions 60B are formed beneath both sides of the dummy gate electrode 4B. The depth of the extension regions 60B is approximately 5 nm.

Then, the entire surface of the device formation region is covered with silicon nitride (SiN) by means of, for example, CVD. Then, in the P-type MOS transistor formation region 1A, side walls 7A are formed along the sides of the laminated gate insulating film 3A, dummy gate electrode 4A, and insulating film 5A by means of, for example, anisotropic etching. At the same time, in the N-type MOS transistor formation region 1B, side walls 7B are formed along the sides of the laminated gate insulating film 3B, dummy gate electrode 4B, and insulating film 5B.

Subsequently, a resist mask is formed on the N-type MOS transistor formation region 1B, and then, in the P-type MOS transistor formation region 1A, the insulating film 5A and the side walls 7A act as masks, while P-type impurities diffusion regions 6A that are located on both sides of the dummy gate electrode 4A, which has been formed on the silicon substrate 1, are ion-implanted with P-type impurities, such as B (boron) ions. The acceleration energy is in the range of 5 to 10 keV, and the amount introduced is in the range of 4 to $8 \times 10^{14}$ [cm$^{-2}$]. Then, annealing is performed in a nitrogen atmosphere at a temperature equal to or higher than 500° C., for example, 1000° C., for 0 to 10 seconds, so that P-type impurities diffusion regions 6A are formed along both sides of the side walls 7A. The depth of the P-type impurities diffusion regions 6A is approximately 20 nm. A resist mask is formed on the P-type MOS transistor formation region 1A, and then, in the N-type MOS transistor formation region 1B, the insulating film 5B and the side walls 7B act as masks, while N-type impurities diffusion regions 60A that are located on both sides of the dummy gate electrode 4B, which has been formed on the silicon substrate 1, are ion-implanted with N-type impurities, such as P ions. The acceleration energy is in the range of 10 to 20 keV, and the amount introduced is in the range of 5 to $10 \times 10^{14}$ [cm$^{-2}$]. Then, annealing is performed in a nitrogen atmosphere at a temperature equal to or higher than 500° C., for example, 1000° C., for 0 to 10 seconds, so that N-type impurities diffusion regions 60A are formed along both sides of the side walls 7B. The depth of the P-type impurities diffusion regions 6A is approximately 20 nm. Then, a totally heat-resistant metal film 8 made of, for example, cobalt (Co) or nickel (Ni) is deposited on the entire surface including the P-type MOS transistor formation region 1A and the N-type MOS transistor formation region 1B by means of, for example, CVD or sputtering.

FIGS. 4E and 4F are cross-sectional diagrams each showing a part of the manufacturing step of a CMOS-type semiconductor apparatus according to the second embodiment.

FIG. 4E is a cross-sectional schematic diagram for major components showing a step of forming silicide electrodes (source electrodes and drain electrodes) in the source/drain regions 6 and 60. As shown in FIG. 4E, the structure shown in FIG. 4D now has silicide electrodes 9A (source electrodes and drain electrodes) formed in the P-type impurities diffusion regions 6A and has silicide electrodes 9B formed in the N-type impurities diffusion regions 60A. A method for forming the silicide electrodes 9A is as follows: the metal film 8 deposited on the entire surface including the P-type MOS transistor formation region 1A and the N-type MOS transistor formation region 1B and the P-type impurities diffusion regions 6A are allowed to react with each other by a heat treatment at approximately 1000° C. for 10 seconds, and then silicide electrodes 9A are formed from a cobalt silicide or a nickel silicide on the P-type impurities diffusion regions 6A. The thickness of the silicide electrodes 9A is on the order of 10 to 20 nm. At the same time, the metal film 8 and the N-type impurities diffusion regions 60A are allowed to react with each other by a heat treatment at approximately 1000° C. for 10 seconds, and then silicide electrodes 9B (source electrodes and drain electrodes) are formed on the N-type impurities diffusion regions 60A. The thickness of the silicide electrodes 9B is on the order of 10 to 20 nm.

Then, unreacted portions of the metal film, which are not shown in the drawing, are removed from the entire surface by, for example, immersion in a sulfuric-acid-containing solution, such as a mixture of sulfuric acid ($H_2SO_4$) and oxydol ($H_2O_2$). Note that the top and sides of the dummy electrode 4A are covered with the insulating film 5A and side walls 7A, and those of the dummy gate electrode 4B are covered with the insulating film 5B and side walls 7B; thus, the dummy electrodes 4A and 4B are not silicidated.

FIG. 4F is a cross-sectional schematic diagram for major components showing a step of removing the insulating film 5A from the dummy gate electrode 4A and a step of removing the insulating film 5B from the dummy gate electrode 4B.

As shown in FIG. 4F, after the configuration shown in FIG. 4E is obtained, an interlayer insulating film 10 is formed from silicon nitride (SiN) on the entire surface by CVD. This interlayer insulating film 10 is desirably thicker than the dummy gate electrodes 4A and 4B but thinner than the total thickness of the dummy gate electrode 4A and the insulating film 5A and than the total thickness of the dummy gate electrode 4B and the insulating film 5B. Then, CMP (Chemical Mechanical Polishing) is performed on the interlayer insulating film 10 in such a manner that the insulating film 5A stays in part on the dummy gate electrode 4A and that the insulating film 5B stays in part on the dummy gate electrode 4B. Then, the portions of the insulating film 5A left on the dummy gate electrode 4A and those of the insulating film 5B left on the dummy gate electrode 4B are removed using diluted hydrofluoric acid (HF).

FIGS. 4G and 4H are cross-sectional diagrams each showing a part of the manufacturing process of a CMOS-type semiconductor apparatus according to the second embodiment.

FIG. 4G is a cross-sectional schematic diagram for major components showing the step of removing the dummy gate electrodes 4A and 4B.

As shown in FIG. 4G, wet etching is performed using an organic alkali solution, such as TMAH (Tetra Methyl Ammonium Hydroxide), in order that the dummy gate electrode 4A is selectively removed with the side walls 7A and the interlayer insulating film 10 left and that the dummy gate electrode 4B is selectively removed with the side walls 7B and the interlayer insulating film 10 left.

FIG. 4H is a cross-sectional schematic diagram for major components showing a step of forming a first gate electrode 12A from amorphous silicon containing no impurities on the gate insulating film 3A and forming a second gate electrode 12B from amorphous silicon containing no impurities on the gate insulating film 3B.

As shown in FIG. 4H, after the structure shown in FIG. 4G is obtained, a laminate of amorphous silicon is formed on the entire surface by CVD under reduced pressure at a temperature in the range of 520 to 540° C. with silane ($SiH_4$) 20%/ helium (He) 80% used as a dilution gas. The use of CVD under reduced pressure results in a maximum decrease in the amount of impurities contained in the amorphous silicon. In this embodiment, the content of impurities is equal to or less than $1 \times 10^{18}$ [cm$^{-3}$]. While the laminate of amorphous silicon is being formed, amorphous silicon is embedded in the gap between the side walls 7A, which have been formed around the dummy gate electrode 4A, and in the gap between the side walls 7B, which have been formed around the dummy gate electrode 4B. Then, in the P-type MOS transistor formation region 1A and the N-type MOS transistor formation region 1B, CMP is performed in order that the side walls 7A and 7B and the interlayer insulating film 10 are exposed, so that the first gate electrode 12A and the second gate electrode 12B, both of which are made of amorphous silicon, are formed in a self-aligned manner.

The reason why amorphous silicon is used to form the gate electrodes 12A and 12B is as follows: amorphous silicon has film characteristics that can be more easily controlled (e.g., in terms of degree of crystallization of silicon) by the heat treatment described later than those of polysilicon and thus is advantageous in forming nickel silicides composed of different kinds of silicide phases having controlled composition ratios of nickel (Ni) and silicon.

FIGS. 4I and 4J are cross-sectional diagrams each showing a part of the manufacturing process of a CMOS-type semiconductor apparatus according to the second embodiment.

FIG. 4I is a cross-sectional schematic diagram for major components showing a step of selectively implanting the second gate electrode 12B formed in the N-type MOS transistor formation region 1B with arsenic (As), an N-type impurity.

As shown in FIG. 4I, after the configuration shown in FIG. 4H is obtained, a resist 15 is formed over the P-type MOS transistor formation region 1A by lithography so that the N-type MOS transistor formation region 1B is exposed. Then, the resist 15 acts as a mask, while the second gate electrode 12B is ion-implanted with arsenic (As), an N-type impurity. The acceleration energy is 40 keV, and the amount introduced is $1 \times 10^{16}$ [cm$^{-2}$]. In this way, the second gate electrode 12B that contains arsenic (As), an N-type impurity, is completed.

FIG. 4J is a cross-sectional schematic diagram for major components showing a heat treatment step for controlling the film characteristics of amorphous silicon that composes the first gate electrode 12A formed in the P-type MOS transistor formation region 1A.

As shown in FIG. 4J, after the configuration shown in FIG. 4I is obtained, the portions of the resist 15 located over the P-type MOS transistor formation region 1A are removed by an oxygen plasma asher. Then, silicon oxide (SiO$_2$) is formed on the entire surface by, for example, CVD. Then, photolithography and anisotropic etching are performed in such a manner that the P-type MOS transistor formation region 1A is selectively exposed. Note that the silicon oxide (SiO$_2$) film 16 is formed over the second gate electrode 12B formed in the N-type MOS transistor formation region 1B for the reason that it can protect the second gate electrode 12B against the heat treatment step (irradiation with laser) for the first gate electrode 12A. Subsequently, a heat treatment step is performed to control the film characteristics of amorphous silicon composing the first gate electrode 12A. More specifically, a heat treatment step is performed to control the film characteristics of amorphous silicon composing the first gate electrode 12A by melting the amorphous silicon by irradiation with laser. The laser output is, for example, in the range of 1000 to 1800 [mJ/cm$^2$]. This step of heat treatment using irradiation with laser results in controlled film characteristics of the amorphous silicon, such as the degree of crystallization of silicon. In addition, the degree of crystallization includes the size and degree of orientation of crystal grains reached after polycrystalline amorphous silicon is obtained by heat treatment.

FIGS. 4K and 4L are cross-sectional diagrams each showing a part of the manufacturing process of a CMOS-type semiconductor apparatus according to the second embodiment.

FIG. 4K is a cross-sectional schematic diagram for major components showing a step of removing the portions of the silicon oxide (SiO$_2$) film 16 from the N-type MOS transistor formation region 1B.

As shown in FIG. 4K, after the situation shown in FIG. 4J is reached, the portions of the silicon oxide (SiO$_2$) film 16 are selectively removed from the N-type MOS transistor formation region 1B using diluted hydrofluoric acid (HF) or the like.

FIG. 4L is a cross-sectional schematic diagram for major components showing a step of depositing nickel (Ni) on the first gate electrode 12A formed in the P-type MOS transistor formation region 1A and on the second gate electrode 12B formed in the N-type MOS transistor formation region 1B.

As shown in FIG. 4L, after the configuration shown in FIG. 4K is obtained, a nickel (Ni) film 13 is deposited on the entire surface including the top of the first gate electrode 12A formed over the P-type MOS transistor formation region 1A and the top of the second gate electrode 12B formed over the N-type MOS transistor formation region 1B by means of, for example, CVD or sputtering until the thickness thereof reaches approximately 60 nm.

FIGS. 4M and 4N are cross-sectional diagrams each showing a part of the manufacturing process of a CMOS-type semiconductor apparatus according to the second embodiment.

FIG. 4M is a cross-sectional schematic diagram for major components showing a step of completing the first gate electrode 14A with nickel silicides obtained by silicidating the amorphous silicon having controlled film characteristics for forming the first gate electrode over the P-type MOS transistor formation region 1A and completing the second gate electrode 14B with nickel silicides obtained by silicidating the amorphous silicon having controlled film characteristics for forming the second gate electrode in the N-type MOS transistor formation region 1B.

As shown in FIG. 4M, after the situation shown in FIG. 4L is reached, RTA is performed for 60 seconds at a temperature of 400° C. so that the amorphous silicon having controlled film characteristics for forming the first gate electrode and the nickel (Ni) 13 react with each other and that the amorphous silicon having controlled film characteristics for forming the second gate electrode and the nickel (Ni) 13 react with each other. In this way, the nickel-silicide-based first gate electrode 14A and the nickel-silicide-based second gate electrode 14B are completed.

FIG. 4N is a cross-sectional schematic diagram for major components showing an unreacted nickel (Ni) removing step.

As shown in FIG. 4N, after the situation shown in FIG. 4M is reached, the nickel-silicide-based first gate electrode 14A formed over the P-type MOS transistor formation region 1A and the nickel-silicide-based second gate electrode 14B formed over the N-type MOS transistor formation region 1B are immersed in a sulfuric-acid-containing solution, such as a mixture of sulfuric acid (H$_2$SO$_4$) and oxydol (H$_2$O$_2$), in order that unreacted portions of the nickel (Ni) 13 remaining on the top of the first and second gate electrodes 14A and 14B are removed.

After the subsequent steps of shaping the interlayer insulating film, contacts, and wiring, a device equipped with the P-type MOS transistor and N-type MOS transistor according to this embodiment is completed.

<Advantages of the CMOS-Type Semiconductor Apparatus According to the Second Embodiment>

Figure 5:
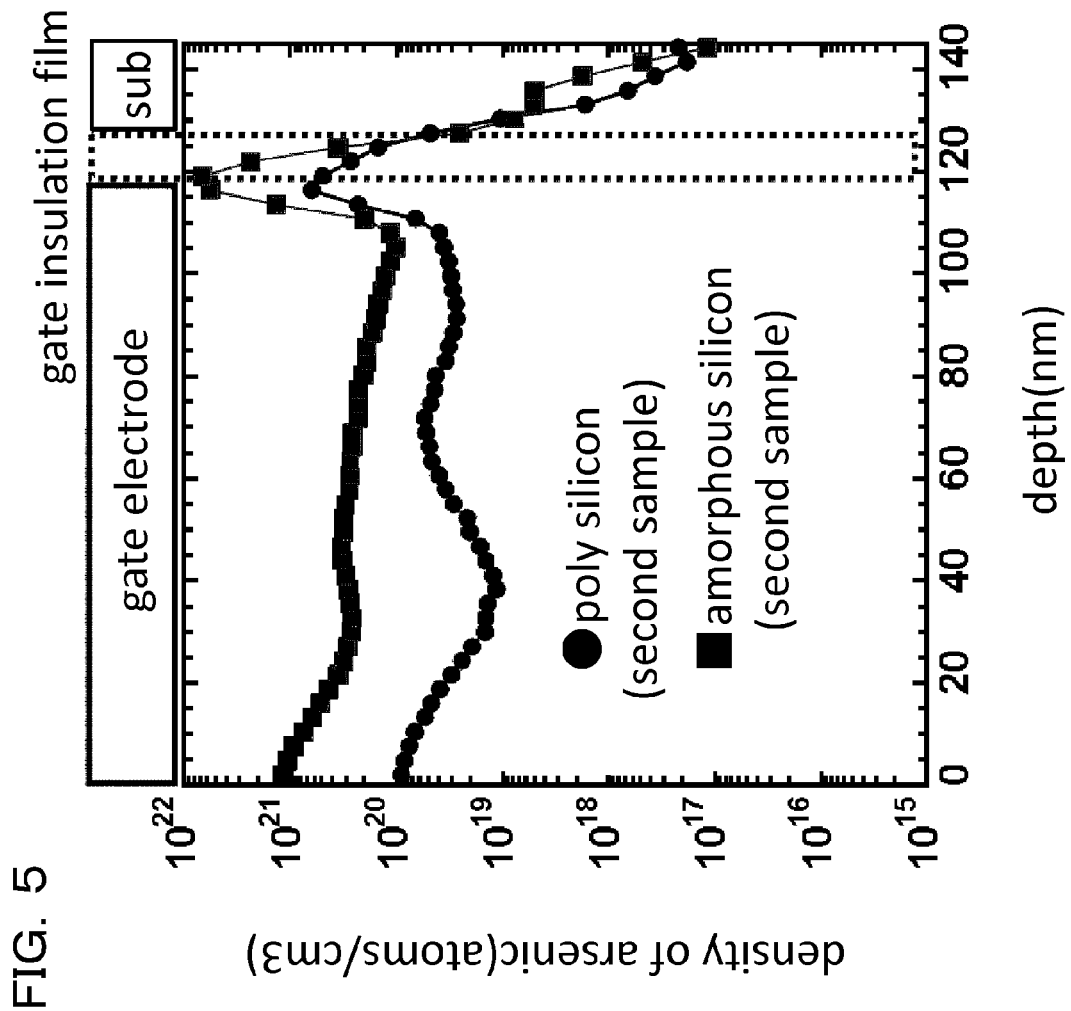
FIG. 5 is a diagram showing the relationship between the depth in a sample gate electrode composed of nickel silicides and the arsenic (As) level obtained for an N-type MOS transistor according to the second embodiment.

FIG. 5 is a diagram showing the relationship between the depth in a sample gate electrode composed of nickel silicides and the arsenic (As) level obtained for an N-type MOS transistor according to the second embodiment.

FIG. 5 shows the result of an analysis in which the density of arsenic (As) contained in the nickel-silicide-based gate electrode 14B and the gate insulating film 3B were determined by SIMS (Secondary Ion Mass Spectrometry) in two samples implanted with the same amount of arsenic (As) but being different in terms of the crystallinity of silicon.

Polysilicon formed on the gate insulating film so as to have a film thickness of approximately 100 nm was ion-implanted with arsenic (As); the acceleration energy was 40 keV, and the amount introduced was $1 \times 10^{16}$ [cm$^{-3}$]. Then, nickel (Ni) was deposited on the polysilicon, and the polysilicon was converted into nickel silicides by RTA. In this way, the first sample was formed.

On the other hand, amorphous silicon formed on the gate insulating film so as to have a film thickness of approximately 100 nm was ion-implanted with arsenic (As); the acceleration energy was 40 keV, and the amount introduced was $1\times10^{16}$ [cm$^{-3}$]. Then, nickel (Ni) was deposited on the amorphous silicon, and the amorphous silicon was converted into nickel silicides by RTA. In this way, the second sample was formed. Note that the formation process of the second sample corresponds to the manufacturing step shown in FIG. 4N according to this second embodiment, in which the second gate electrode 14B is formed in the N-type MOS transistor formation region 1B.

In FIG. 5, filled squares represent the density of arsenic (As) measured in the first sample, whereas filled circles represent that measured in the second sample. The horizontal axis of the graph shown in FIG. 5 represents the depth (position) in the nickel-silicide-based gate electrode; the position indicated by a depth of 0 corresponds to the surface of the nickel-silicide-based gate electrode. The vertical axis of the graph shown in FIG. 5 represents the density of arsenic (As) [atoms/cm$^3$].

FIG. 5 suggests that, in the first sample, arsenic (As) segregates onto the boundary between the gate electrode and the gate insulating film with a density of approximately $5\times10^{21}$ [atoms/cm$^3$] and that, in the second sample, arsenic (As) segregates onto the boundary between the gate electrode and the gate insulating film with a density of approximately $6\times10^{21}$ [atoms/cm$^3$]. This means that the amount of arsenic (As) segregating onto the boundary between the nickel-silicide-based gate electrode and the gate insulating film is greater in the second sample than in the first sample. Therefore, the manufacturing step according to this second embodiment allows more arsenic (As) to segregate onto the boundary between the gate electrode and the gate insulating film of an N-type MOS transistor than an ordinary manufacturing method.

Figure 6:
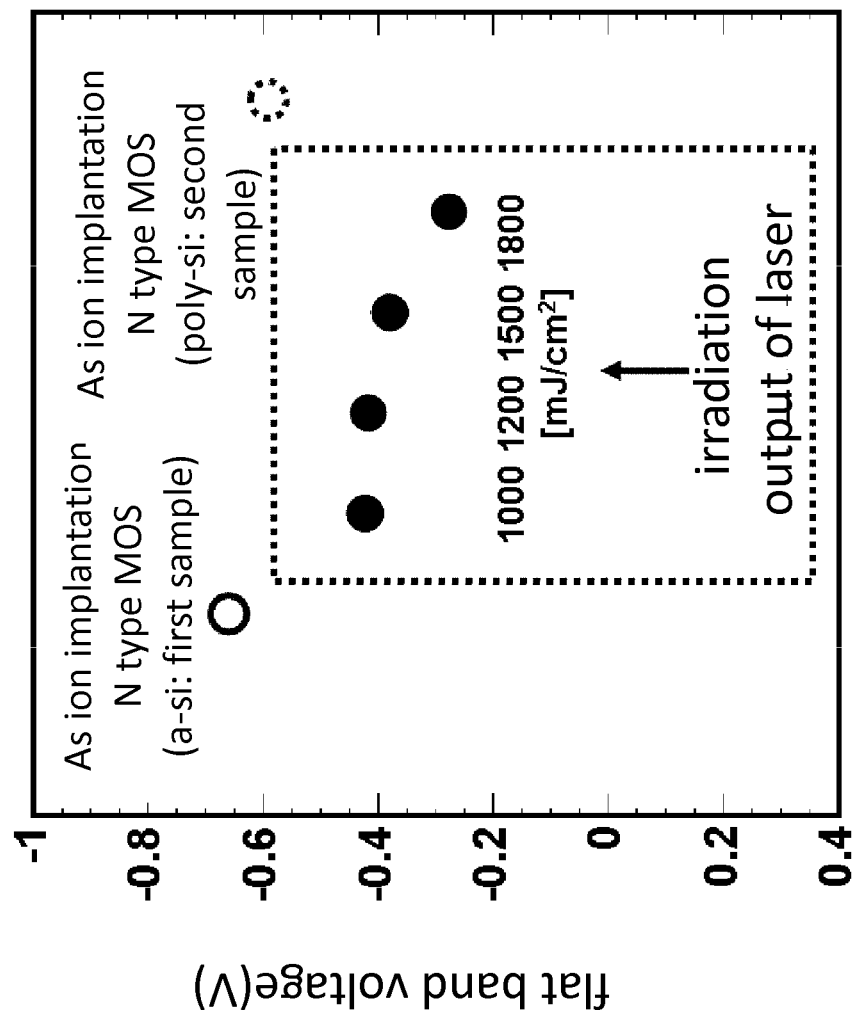
FIG. 6 is a diagram showing the changes in flat band voltage obtained for a P-type MOS transistor and an N-type MOS transistor according to the second embodiment.

FIG. 6 shows a flat band voltage obtained for a P-type MOS transistor according to the second embodiment and that obtained for an N-type MOS transistor according to the second embodiment.

The horizontal axis of the graph shown in FIG. 6 represents conditions under which the samples were irradiated with laser during a heat treatment step based on irradiation with laser or the kind of samples produced following different manufacturing processes of an N-type MOS transistor. For example, "1000 [mJ/cm$^2$]" seen in FIG. 6 represents a condition under which the samples were irradiated with laser. The conditions under which the samples were irradiated with laser were 1000 [mJ/cm$^2$], 1200 [mJ/cm$^2$], 1500 [mJ/cm$^2$], and 1800 [mJ/cm$^2$]. As for the P-type MOS transistors heated by irradiation with laser, the flat band voltages obtained under the individual laser irradiation conditions are represented by filled circles enclosed with broken lines. As for the N-type MOS transistor that has a gate electrode formed under the same conditions as the first sample described with reference to FIG. 5, the flat band voltage is represented by an open circle drawn with a broken line. As for the N-type MOS transistor that has a gate electrode formed under the same conditions as the second sample, the flat band voltage is represented by an open circle drawn with a solid line.

Note that the first sample described with reference to FIG. 5 was obtained in the following way: polysilicon formed on the gate insulating film 3 so as to have a film thickness of approximately 100 nm was ion-implanted with arsenic (As) with the acceleration energy set at 40 keV and the amount introduced set at $1\times10^{16}$ [cm$^{-3}$], and then the polysilicon was converted into nickel silicides by RTA. Also, the second sample described with reference to FIG. 5 was obtained in the following way: amorphous silicon formed on the gate insulating film 3 so as to have a film thickness of approximately 100 nm was ion-implanted with arsenic (As) with the acceleration energy set at 40 keV and the amount introduced set at $1\times10^{16}$ [cm$^{-3}$], and then polysilicon was converted into nickel silicides by RTA.

FIG. 6 indicates that the flat band voltages of the P-type MOS transistors heated by irradiation with laser at different irradiation outputs range from $-0.43$ [V] to $-0.28$ [V], namely, exhibit some positive change, with increase in the irradiation output of laser from 1000 [mJ/cm$^2$] to 1800 [mJ/cm$^2$]. In other words, changes in the film characteristics of amorphous silicon caused by heating, such as promoted crystallization of amorphous silicon, result in a higher flat band voltage of a P-type MOS transistor. The reason why this occurs is the same as those described with reference to FIGS. 4 and 5.

FIG. 6 also provides an observation regarding the N-type MOS transistors that the flat band voltage was $-0.60$ [V] in the N-type MOS transistor contained in the first sample whereas that was $-0.66$ [V] in the N-type MOS transistor contained in the second sample. This is probably because the second sample allowed more arsenic (As) to segregate onto the boundary between its nickel-silicide-based gate electrode and gate insulating film than the first sample.

In addition, such a shift of flat band voltage caused by an increased amount of arsenic (As) segregating onto the boundary is probably due to changes in the work functions of the nickel silicides from their original values.

In this second embodiment, there is a difference in flat band voltage of 0.23 [V] between the P-type MOS transistor obtained after heating by irradiation with laser at a laser output of 1000 [mJ/cm$^3$] and the N-type MOS transistor formed in the first sample, and there is a difference in flat band voltage of 0.38 [V] between the P-type MOS transistor obtained after heating by irradiation with laser at a laser output of 1800 [mJ/cm$^3$] and the N-type MOS transistor formed in the second sample.

This means that, in a CMOS-type semiconductor apparatus according to the second embodiment, it is possible to control the difference in flat band voltage between the P-type MOS transistor and the N-type MOS transistor by controlling the output of laser used to irradiate the amorphous silicon to be formed into the gate electrode of the P-type MOS transistor or the amount of arsenic (As) introduced into the amorphous silicon to be formed into the gate electrode of the N-type MOS transistor.

The method for manufacturing a CMOS-type semiconductor apparatus according to the second embodiment is a method for manufacturing a CMOS-type semiconductor apparatus having a P-type MOS transistor and an N-type MOS transistor; it includes a step of preparing a substrate having a P-type MOS transistor formation region taking on N-type and an N-type MOS transistor formation region taking on P-type, a gate insulating film formation step for forming a gate insulating film from a highly dielectric insulating film on the surface of the substrate, a step of forming a first gate electrode from amorphous silicon on the gate insulating film over the P-type MOS transistor formation region and forming a second gate electrode from amorphous silicon on the gate insulating film over the N-type MOS transistor formation region, a heat treatment step for selectively controlling the film characteristics of the amorphous silicon composing the first gate electrode, a subsequent step of depositing nickel (Ni) on the first and second gate electrodes, and a step of completing the first and second gate electrodes with nickel silicides via reactions between the amorphous silicon composing the first gate electrode and the nickel (Ni) and between the amorphous silicon composing the second gate electrode and the nickel (Ni).

The manufacturing method described above includes a heat treatment step for controlling the film characteristics of amorphous silicon, providing a way to manufacture P-type MOS transistors whose gate electrode is composed of nickel silicides containing different kinds of polyvalent nickel silicides (e.g., $Ni_3Si$). Also, it provides an easy way to control the status of mixing of the different kinds of polyvalent nickel silicides (e.g., $Ni_3Si$) by controlling the degree of heating for controlling the film characteristics of the amorphous silicon.

Furthermore, the heat treatment for controlling the film characteristics of amorphous silicon never changes the shape of gate electrodes. This provides simplicity in manufacturing gate electrodes composed of nickel silicides containing polyvalent nickel silicides (e.g., $Ni_3Si$) or those made of a basic nickel silicide (NiSi) on case-by-case basis.

In addiction, the method for manufacturing a CMOS-type semiconductor apparatus according to the second embodiment includes a step of implanting amorphous silicon composing the second gate electrode with arsenic (As). After this step, the amorphous silicon is allowed to react with nickel (Ni) to complete the nickel-silicide-based second gate electrode, while the arsenic (As) segregates onto the boundary between the second gate electrode and the gate insulating film. The flat band voltage of the N-type MOS transistor can be controlled to decrease by controlling the amount of segregating arsenic (As).

In addition, such a shift of flat band voltage caused by an increased amount of arsenic (As) segregating onto the boundary is probably due to changes in the work functions of the nickel silicides from their original values.

Also, the difference in flat band voltage between the N-type MOS transistor and the P-type MOS transistor can be further increased by setting the amount of arsenic (As) introduced into the amorphous silicon so as to allow the amount of the segregating arsenic (As) to be equal to or greater than $6\times10^{21}$ [$cm^{-3}$].

Additionally, in the method for manufacturing a CMOS-type semiconductor apparatus according to the second embodiment, the step of forming a first gate electrode from amorphous silicon on the gate insulating film over the P-type MOS transistor formation region and forming a second gate electrode from amorphous silicon on the gate insulating film over the N-type MOS transistor formation region includes a step of forming a first dummy gate electrode corresponding to the first gate electrode and a second dummy gate electrode corresponding to the second gate electrode, a step of forming side walls from an insulating material on both sides of the first and second dummy gate electrodes, a step of removing the first and second dummy gate electrodes, and a step of forming the first and second gate electrodes by embedding amorphous silicon only in the gap between the side walls.

Configured as above, the step of forming the first and second gate electrodes has an advantage of preventing any heat treatment other than that for controlling the film characteristics of amorphous silicon from affecting the first and second gate electrodes before nickel (Ni) is deposited on the gate electrodes.

The CMOS-type semiconductor apparatus according to the second embodiment contains a substrate having a P-type MOS transistor formation region taking on N-type conductivity and an N-type MOS transistor formation region taking on P-type conductivity, a gate insulating film formed from a highly dielectric insulating film on the surface of the substrate, a P-type MOS transistor that is formed on the gate insulating film over the P-type MOS transistor formation region and has a first gate electrode composed of nickel silicides containing different kinds of silicide phases, and an N-type MOS transistor that is formed on the gate insulating film over the N-type MOS transistor formation region and has a second gate electrode composed of nickel silicides whose main ingredient is nickel monosilicide (NiSi).

The boundary between the second gate electrode formed in the N-type MOS transistor and the insulating film retains arsenic (As) segregating thereonto. Desirably, the density of arsenic (As) segregating onto this boundary is equal to or greater than $6\times10^{21}$ [$cm^{-3}$].

The first gate electrode contained in the P-type MOS transistor is composed of nickel silicides, which contain polyvalent nickel silicides (e.g., $Ni_3Si$), in order that the flat band voltage of the P-type MOS transistor can be set at a predetermined value. This means that the threshold of the P-type MOS transistor has a predetermined value. On the other hand, the second gate electrode contained in the N-type MOS transistor is composed of monovalent nickel silicide, and thus the flat band voltage of the N-type MOS transistor is that determined by the monovalent nickel silicide and the P-type silicon substrate. This means that the threshold of the N-type MOS transistor is that determined by the monovalent nickel silicide and the P-type silicon substrate. Consequently, the difference in flat band voltage between the P-type MOS transistor and the N-type MOS transistor is controlled to be a predetermined value.

This difference in flat band voltage can be further increased by ensuring that the boundary between the second gate electrode formed in the N-type MOS transistor and the insulating film retains arsenic (As) segregating thereonto, in particular, arsenic (As) segregating with a density equal to or greater than $6\times10^{21}$ [$cm^{-3}$].

Description of Third Embodiment

The third embodiment is described with reference to FIGS. 7A to 7N, and FIG. 28. The third embodiment is an embodiment in which the heat treatment step of the second embodiment is changed from a heat treatment by irradiation with laser to one by RTA. More specifically, a CMOS-type semiconductor apparatus according to the third embodiment contains a P-type MOS transistor that has a first gate electrode obtained after a step of controlling the film characteristics of amorphous silicon by heating based on RTA (rapid thermal anneal) followed by forming nickel silicides from the amorphous silicon.

The first gate electrode of the resultant P-type MOS transistor is composed of polyvalent nickel silicides (e.g., $Ni_3Si$), and thus a greater difference in flat band voltage occurs between the capacitor relating to the first gate electrode of the P-type MOS transistor and that of the capacitor relating to a second gate electrode of an N-type MOS transistor.

Figure 7A:
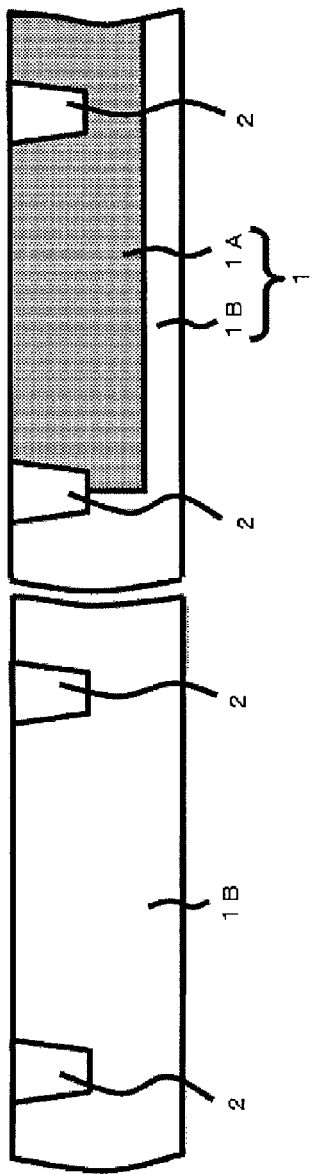
FIG. 7A to 7N are cross-sectional diagrams each showing a part of a manufacturing process of a CMOS-type semiconductor apparatus according to the third embodiment.
Figure 8:
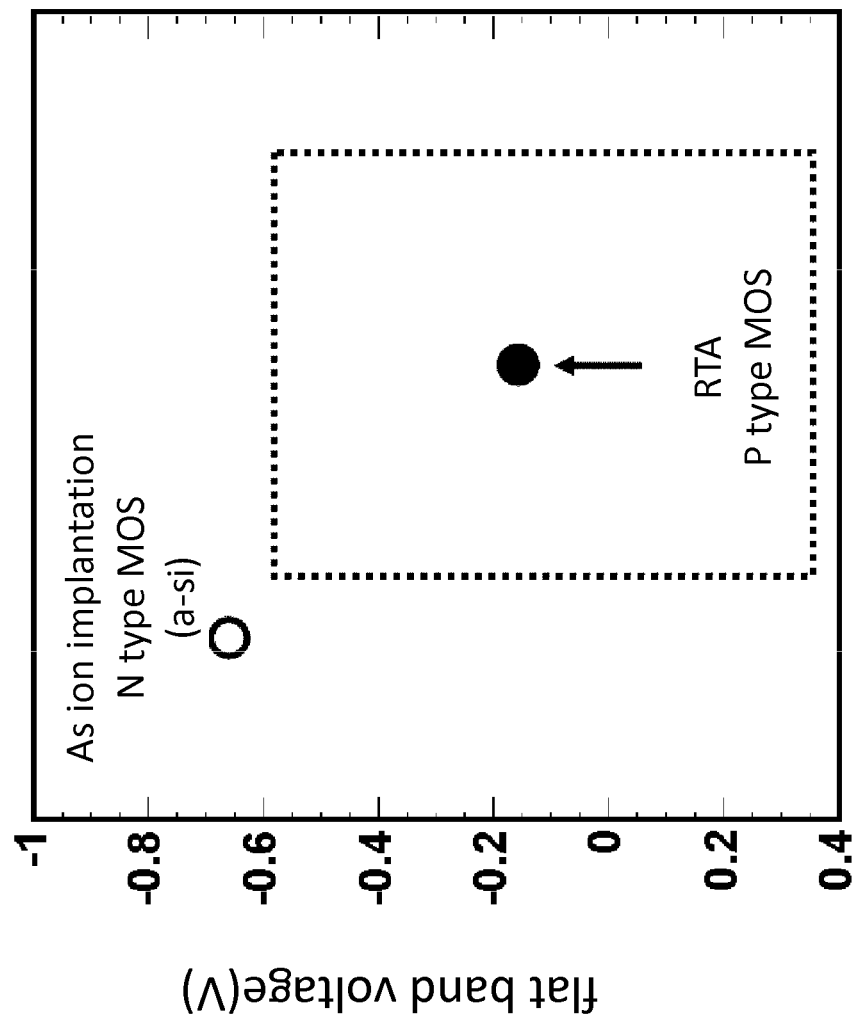
FIG. 8 is a diagram showing flat band voltages obtained for a P-type MOS transistor and an N-type MOS transistor according to the third embodiment.

FIGS. 7A to 7N are cross-sectional schematic diagrams for major components each showing a manufacturing step of a P-type MOS transistor and an N-type MOS transistor according to the third embodiment. FIG. 8 is a diagram showing data measured by the present inventor for the P-type MOS transistor and the N-type MOS transistor according to the third embodiment.

<Manufacturing Process of a CMOS-Type Semiconductor Apparatus According to the Third Embodiment>

FIG. 7A is a cross-sectional schematic diagram for major components showing a step of preparing a substrate that has a P-type MOS transistor formation region taking on N-type and an N-type MOS transistor formation region taking on P-type. FIG. 7A shows a silicon substrate 1 that has a P-type MOS transistor formation region 1A taking on N-type and an N-type MOS transistor formation region 1B taking on P-type and device separators 2.

Figure 7B:
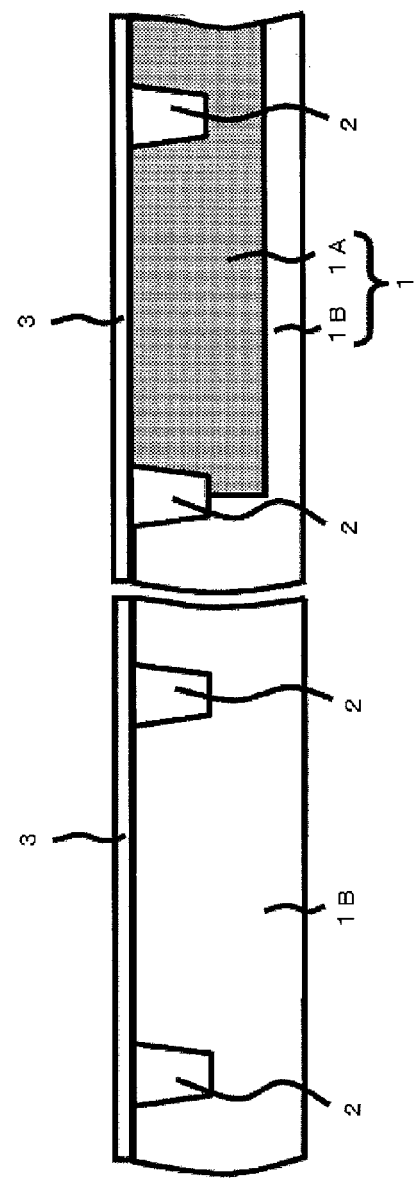

FIGS. 7A and 7B are cross-sectional diagrams each showing a part of a manufacturing process of a CMOS-type semiconductor apparatus according to the third embodiment.

The step of forming the structure shown in FIG. 7A is detailed. First, the P-type MOS transistor formation region 1A of a P-type silicon substrate 1 is ion-implanted with N-type impurities, and then the silicon substrate 1 is annealed so that the silicon substrate 1 is prepared to have a P-type MOS transistor formation region 1A and an N-type MOS transistor formation region 1B. Then, device separators 2 for partitioning devices are formed on the P-type MOS transistor formation region 1A and the N-type MOS transistor formation region 1B of the silicon substrate 1 by, for example, LOCOS or STI.

FIG. 7B is a cross-sectional schematic diagram for major components showing a gate insulating film formation step for forming a gate insulating film 3 from a highly dielectric insulating film on the surface of the substrate 1. FIG. 7B shows a gate insulating film 3 made of a highly dielectric insulating film besides the configuration shown in FIG. 7A.

The step of forming the structure shown in FIG. 7B is detailed. The entire surface of the silicon substrate 1, which has the device separators 2 formed therein, is covered with a gate insulating film 3 made of a highly dielectric insulating film (a high-K film). The gate insulating film 3 has a thickness of approximately 3.5 nm after being formed by, for example, CVD. In this embodiment, the gate insulating film 3 is an insulating hafnium (Hf) oxide having a higher dielectric constant than silicon oxide ($SiO_2$) and is composed of, for example, nitrogen-containing hafnium silicate (HfSiON) or hafnium silicate (HfSiO); however, the gate insulating film 3 may be an ordinary silicon oxide film ($SiO_2$).

Figure 7C:
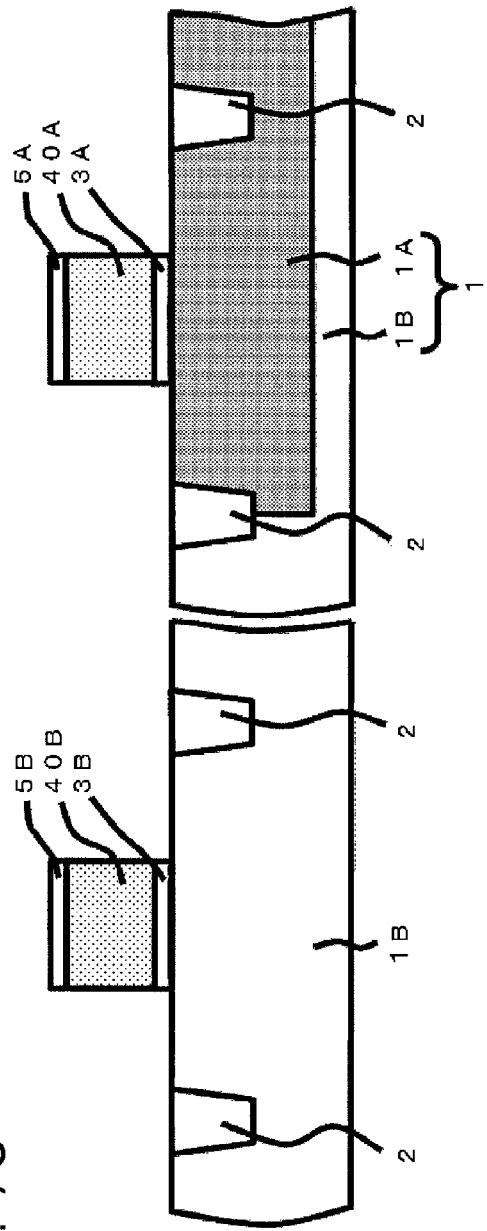
Figure 7D:
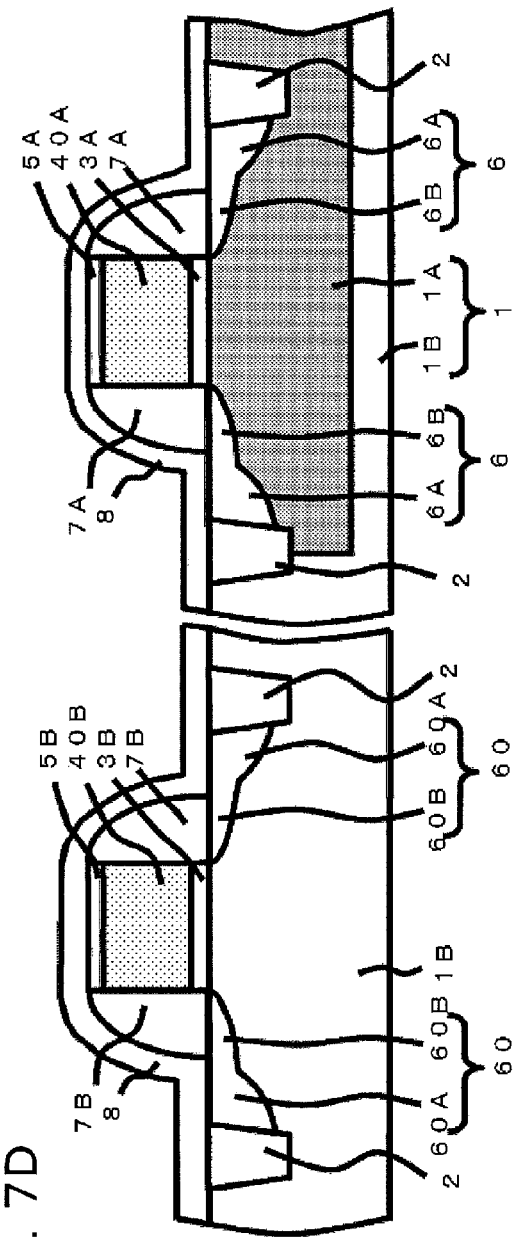

FIGS. 7C and 7D are cross-sectional diagrams each showing a part of the manufacturing process of a CMOS-type semiconductor apparatus according to the third embodiment.

FIG. 7C is a cross-sectional diagram for major components showing a step of forming a first gate electrode from amorphous silicon containing no impurities on the gate insulating film over the P-type MOS transistor formation region and forming a dummy gate electrode over the N-type MOS transistor formation region. As for the P-type MOS transistor formation region 1A, FIG. 7C shows a gate insulating film 3A, an amorphous-silicon-based gate electrode 40A, and an insulating film 5A made of silicon oxide ($SiO_2$) besides the configuration shown in FIG. 7B; as for the N-type MOS transistor formation region 1B, it shows a gate insulating film 3B, an amorphous-silicon-based dummy gate electrode 40B, and an insulating film 5B made of silicon oxide ($SiO_2$) besides the configuration shown in FIG. 7B. Note that the step of forming a gate electrode over the N-type MOS transistor formation region 1B according to this embodiment consists of a step of forming a dummy gate electrode 40B, a step of removing the dummy gate electrode 40B, and a step of forming an amorphous-silicon-based gate electrode 12B in the site from which the dummy gate electrode 40B has been removed. However, this gate electrode formation step excludes a source/drain region formation step, which comes between the step of forming a dummy gate electrode 40B and the step of removing the dummy gate electrode 40B.

The step of forming the structure shown in FIG. 7C is detailed. The material for forming the gate electrode 40A and the dummy gate electrode 40B, polysilicon, is deposited on the gate insulating film 3 until the thickness thereof reaches approximately 100 nm by means of, for example, CVD (Chemical Vapor Deposition) under reduced pressure at a temperature in the range of 520 to 540° C. with silane ($SiH_4$) 20%/helium (He) 80% used as a dilution gas. The use of CVD under reduced pressure results in a maximum decrease in the amount of impurities contained in the amorphous silicon. In this embodiment, the content of impurities is equal to or less than $1 \times 10^{18}$ [$cm^{-3}$]. Then, the material for forming the insulating films 5A and 5B, for example, silicon oxide ($SiO_2$), is formed on the amorphous silicon by means of, for example, CVD.

Subsequently, lithography and anisotropic etching or other techniques are performed to shape the gate insulating film 3, amorphous silicon, and silicon oxide ($SiO_2$) into the pattern of a gate electrode that is constituted by the gate insulating film 3A, gate electrode 40A, and insulating film 5A on the P-type MOS transistor formation region 1A. At the same time, the gate insulating film 3, amorphous silicon, and silicon oxide ($SiO_2$) are shaped into the pattern of a gate electrode that is constituted by the gate insulating film 3B, dummy gate electrode 40B, and insulating film 5B on the N-type MOS transistor formation region 1B.

FIG. 7D is a cross-sectional schematic diagram for major components showing a step of forming source/drain regions on both sides of the gate electrode and on those of the dummy gate electrode. As for the P-type MOS transistor formation region 1A, FIG. 7D shows source/drain regions 6 each consisting of an extension region 6B and a P-type impurities diffusion region 6A, side walls 7A, and a metal film 8 besides the configuration shown in FIG. 7C; as for the N-type MOS transistor formation region 1B, it shows source/drain regions 60 each consisting of an extension region 60B and a P-type impurities diffusion region 60A, side walls 7B, and a metal film 8 besides the configuration shown in FIG. 7C.

The step of forming the structure shown in FIG. 7D is detailed. A resist mask is formed on the N-type MOS transistor formation region 1B after the structure shown in FIG. 7C is shaped, and then the insulating film 5A acts as a mask, while the P-type MOS transistor formation region 1A, which takes on N-type, is ion-implanted with P-type impurities, such as B (boron) ions. The acceleration energy is in the range of 1 to 5 keV, and the amount introduced is in the range of 5 to $10 \times 10^{14}$ [$cm^{-2}$]. Then, RTA is performed in a nitrogen atmosphere at a temperature equal to or higher than 500° C., for example, 1000° C., for 0 to 10 seconds, so that extension regions 6B are formed beneath both sides of the gate electrode 40A. The depth of the extension regions 6B is approximately 5 nm. Note that a heat treatment that is conducted at a high temperature for a short period of time is referred to as RTA (Rapid Thermal Annealing).

After that, another resist mask is formed on the P-type MOS transistor formation region 1A, and then the N-type MOS transistor formation region 1B, which takes on P-type, is ion-implanted with N-type impurities, such as P (phosphorus) ions. The acceleration energy is in the range of 5 to 15 keV, and the amount introduced is in the range of 5 to $10 \times 10^{14}$ [$cm^{-2}$]. Then, RTA is performed in a nitrogen atmosphere at a temperature equal to or higher than 500° C., for example, 1000° C., for 0 to 10 seconds, so that extension regions 60B are formed beneath both sides of the dummy gate electrode 4B. The depth of the extension regions 60B is approximately 5 nm.

Then, the entire surface of the device formation region is covered with silicon nitride (SiN) by means of, for example, CVD. Then, in the P-type MOS transistor formation region 1A, side walls 7A are formed along the sides of the laminated gate insulating film 3A, gate electrode 40A, and insulating film 5A by means of, for example, anisotropic etching. At the same time, in the N-type MOS transistor formation region 1B, side walls 7B are formed along the sides of the laminated gate insulating film 3B, dummy gate electrode 40B, and insulating film 5B.

Subsequently, a resist mask is formed on the N-type MOS transistor formation region 1B, and then, in the P-type MOS transistor formation region 1A, the insulating film 5A and the side walls 7A act as masks, while P-type impurities diffusion regions 6A that are located on both sides of the gate electrode 40A, which has been formed on the silicon substrate 1, are ion-implanted with P-type impurities, such as B (boron) ions. The acceleration energy is in the range of 5 to 10 keV, and the amount introduced is in the range of 4 to $8 \times 10^{14}$ [cm$^{-2}$]. Then, annealing is performed in a nitrogen atmosphere at a temperature equal to or higher than 500° C., for example, 1000° C., for 0 to 10 seconds, so that P-type impurities diffusion regions 6A are formed along both sides of the side walls 7A. The depth of the P-type impurities diffusion regions 6A is approximately 20 nm. A resist mask is formed on the P-type MOS transistor formation region 1A, and then, in the N-type MOS transistor formation region 1B, the insulating film 5B and the side walls 7B act as masks, while N-type impurities diffusion regions 60A that are located on both sides of the dummy gate electrode 40B, which has been formed on the silicon substrate 1, are ion-implanted with N-type impurities, such as P (phosphorus) ions. The acceleration energy is in the range of 10 to 20 keV, and the amount introduced is in the range of 5 to $10 \times 10^{14}$ [cm$^{-2}$]. Then, RTA is performed in a nitrogen atmosphere at a temperature equal to or higher than 500° C., for example, 1000° C., for 0 to 10 seconds, so that N-type impurities diffusion regions 60A are formed along both sides of the side walls 7B. The depth of the P-type impurities diffusion regions 60A is approximately 20 nm. Then, a totally heat-resistant metal film 8 made of, for example, cobalt (Co) or nickel (Ni) is deposited on the entire surface including the P-type MOS transistor formation region 1A and the N-type MOS transistor formation region 1B by means of, for example, CVD or sputtering.

FIGS. 7E and 7F are cross-sectional diagrams each showing a part of the manufacturing step of a CMOS-type semiconductor apparatus according to the third embodiment.

FIG. 7E is a cross-sectional schematic diagram for major components showing a step of performing RTA for forming silicide electrodes (source electrodes and drain electrodes) in the source/drain regions 6 and 60 and for simultaneously controlling the film characteristics of amorphous silicon. FIG. 7E shows silicide electrodes 9A (source electrodes and drain electrodes) formed in the P-type impurities diffusion regions 6A and silicide electrodes 9B formed in the N-type impurities diffusion regions 60A besides the configuration shown in FIG. 7D.

The step of forming the structure shown in FIG. 7E is detailed. Besides the structure shown in FIG. 7D, silicide electrodes 9A and 9B are formed in the P-type impurities diffusion regions 6A and the N-type impurities diffusion regions 60A, respectively. A method for forming the silicide electrodes 9A is as follows: the metal film 8 deposited on the entire surface are allowed to react with the P-type impurities diffusion regions 6A and the N-type impurities diffusion regions 60A at approximately 1000° C. for 10 seconds by means of, for example, RTA at a temperature of 1000° C. for 0 to 10 seconds. Then, silicide electrodes 9A composed of a cobalt silicide or a nickel silicide are formed on the P-type impurities diffusion regions 6A, and silicide electrodes 9B are formed on the N-type impurities diffusion regions 60A. The thickness of the silicide electrodes 9A and 9B is on the order of 10 to 20 nm. Note that the film characteristics of amorphous silicon composing the gate electrode 40A and dummy gate electrode 40B are controlled simultaneously by this RTA treatment. In other words, after treated by RTA, the gate electrode 40A and the dummy gate electrode 40B are composed of polycrystalline silicon. Even when RTA is used to convert the amorphous silicon into the polycrystalline form, this heat treatment can control the degree of crystallization, such as the size and degree of orientation of crystal grains, of course.

Then, unreacted portions of the metal film, which are not shown in the drawing, are removed from the entire surface by immersion in a sulfuric-acid-containing solution, such as a mixture of sulfuric acid (H$_2$SO$_4$) and oxydol (H$_2$O$_2$). Note that the top and sides of the gate electrode 40A are covered with the insulating film 5A and side walls 7A, and those of the dummy gate electrode 40B are covered with the insulating film 5B and side walls 7B; thus, the gate electrode 40A and dummy gate electrode 40B are not silicidated.

FIG. 7F is a cross-sectional schematic diagram for major components showing a step of forming an interlayer insulating film. FIG. 7F shows an interlayer insulating film 10 besides the configuration shown in FIG. 7E.

The step of forming the structure shown in FIG. 7F is detailed. First, after the configuration shown in FIG. 7E is shaped, an interlayer insulating film 10 is formed from silicon nitride (SiN) on the entire surface by CVD. This interlayer insulating film 10 is desirably thicker than the gate electrode 40A and dummy gate electrode 40B but thinner than the total thickness of the gate electrode 40A and the insulating film 5A and than the total thickness of the dummy gate electrode 40B and the insulating film 5B. Then, CMP (Chemical Mechanical Polishing) is performed on the interlayer insulating film 10 in such a manner that the insulating film 5A stays in part on the gate electrode 4A and that the insulating film 5B stays in part on the dummy gate electrode 40B.

Figure 7G:
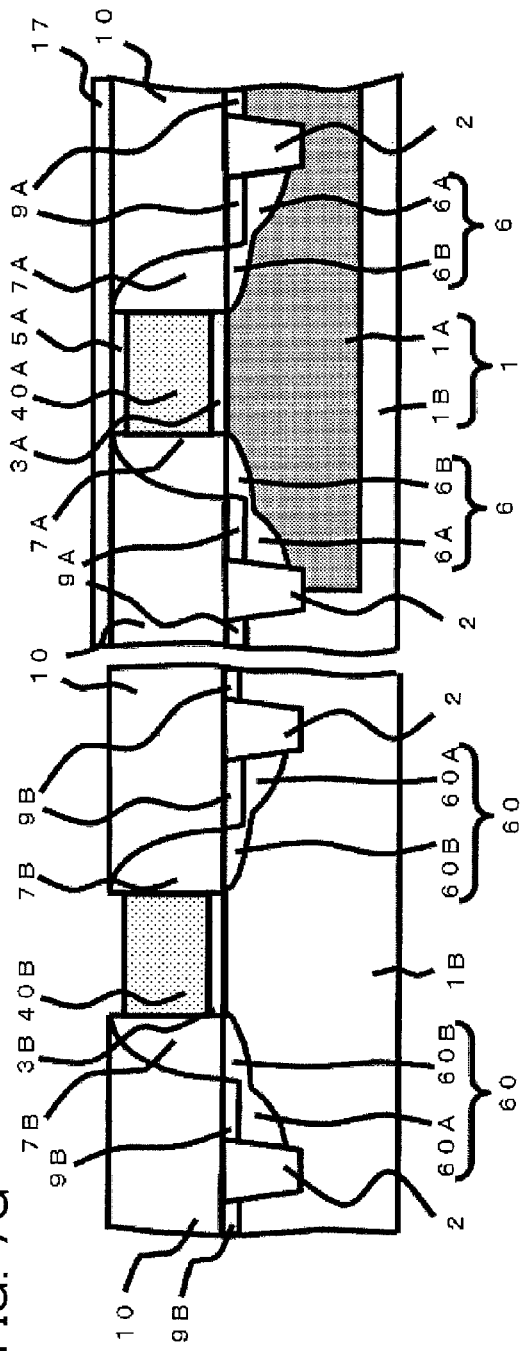
Figure 7H:
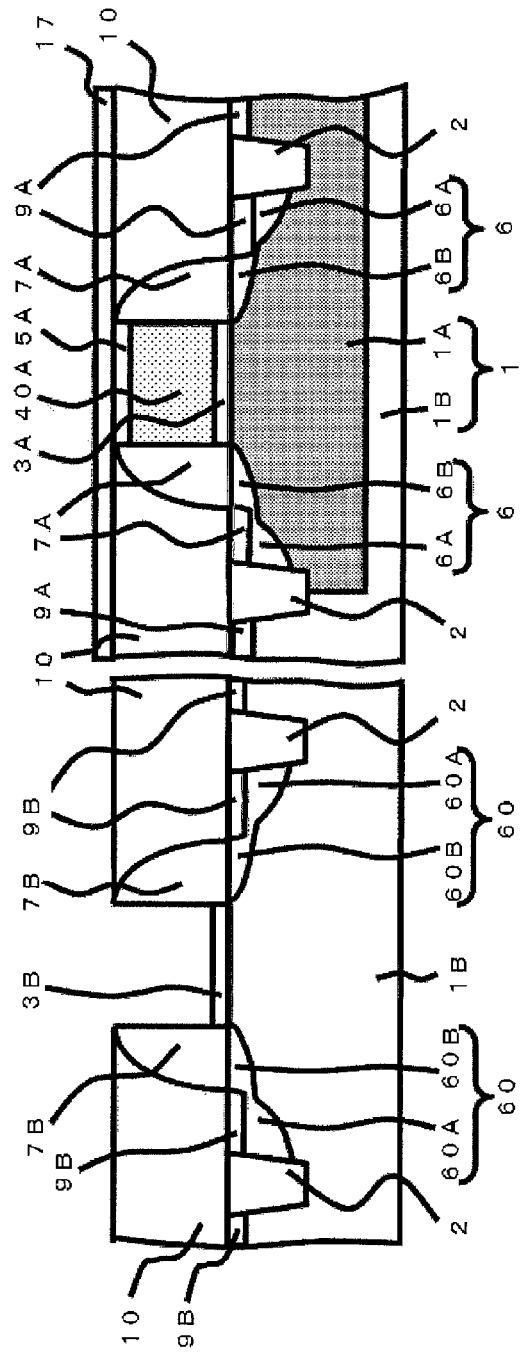

FIGS. 7G and 7H are cross-sectional diagrams each showing a part of the manufacturing process of a CMOS-type semiconductor apparatus according to the third embodiment.

FIG. 7G is a cross-sectional diagram for major components showing a step of removing the gate insulating film 5B from the dummy gate electrode 40B. FIG. 7G shows, besides the configuration shown in FIG. 7F, a structure in which a resist 17 is formed over the P-type MOS transistor formation region 1A and the insulating film 5B has been removed from the dummy gate electrode 40B.

The step of forming the structure shown in FIG. 7G is detailed. After the structure shown in FIG. 7E is completed, a resist 17 is formed over the P-type MOS transistor formation region 1A by lithography so that the N-type MOS transistor formation region 1B is exposed. Then, the insulating film 5B is removed from the dummy gate electrode 40B using diluted hydrofluoric acid (HF).

FIG. 7H is a cross-sectional diagram for major components showing a step of removing the dummy gate electrode 40B. FIG. 7H shows a structure in which the dummy gate electrode 40B has been removed after the completion of the step shown in FIG. 7G.

The step of forming the structure shown in FIG. 7H is detailed. Wet etching is performed using an organic alkali solution, such as TMAH (Tetra Methyl Ammonium Hydroxide), in order that the dummy gate electrode 40B is selectively removed with the side walls 7B and the interlayer insulating film 10 left.

FIGS. 7I and 7J are cross-sectional diagrams each showing a part of the manufacturing process of a CMOS-type semiconductor apparatus according to the third embodiment.

FIG. 7I is a cross-sectional diagram for major components showing a step of removing the resist 17 from the gate electrode 40A. FIG. 7I illustrates the removal of the resist 17 from the P-type MOS transistor formation region 1A by means of, for example, an oxygen plasma asher following the completion of the situation shown in FIG. 7H.

FIG. 7J is a cross-sectional schematic diagram for major components showing a step of implanting amorphous silicon composing a second gate electrode with arsenic (As), an N-type impurity. FIG. 7J shows, besides the configuration shown in FIG. 7I, amorphous silicon 18 that composes the second gate electrode.

The step of forming the structure shown in FIG. 7J is detailed. After the situation shown in FIG. 7I is reached, the material of the gate electrode 40A and a gate electrode 12B, amorphous silicon 18, is deposited on the entire surface by, for example, CVD under reduced pressure at a temperature in the range of 520 to 540° C. with silane ($SiH_4$) 20%/helium (He) 80% or the like used as a dilution gas. While the laminate of amorphous silicon 18 is being formed, the amorphous silicon 18 is embedded in the gap between the side walls 7A, which have been formed around the dummy gate electrode 40B. Then, CMP is performed to remove the amorphous silicon from the interlayer insulating film 10 while leaving the portions of the amorphous silicon that exist over the dummy gate electrode 40. In this way, the gate electrode 12B is formed. Subsequently, the second gate electrode 12B, which has been formed over the N-type MOS transistor formation region 1B, is ion-implanted with arsenic (As), an N-type impurity, with the acceleration energy set at 40 keV and the amount introduced set at $1 \times 10^{16}$ [$cm^{-2}$]. Note that the gate electrode 40A, which has been formed over the P-type MOS transistor formation region 1A, is protected by the insulating film 5A against ion implantation with arsenic (As).

During the downstream step in which the second gate electrode 12B of the N-type MOS transistor is made composed of nickel silicides, arsenic (As) mentioned above segregates onto the boundary between the second gate electrode 12B and the gate insulating film. An increased amount of arsenic (As) segregating onto the boundary results in a shift of the flat band voltage of the N-type MOS transistor. This is probably because of changes in the work functions of the nickel silicides that compose the second gate electrode 12B of the N-type MOS transistor from their original values.

Figure 7K:
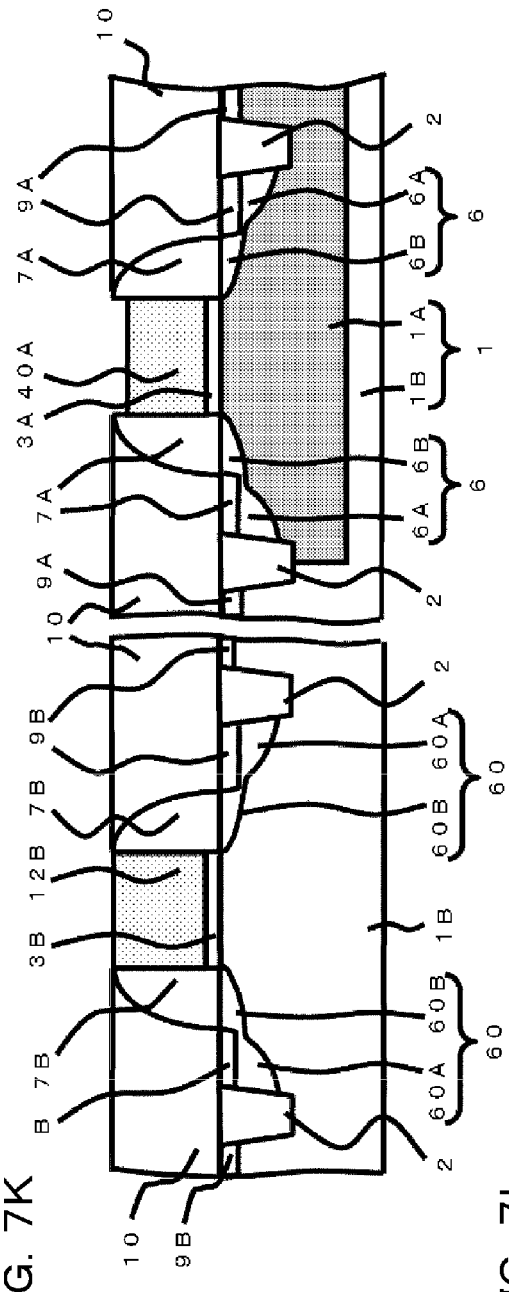
Figure 7L:
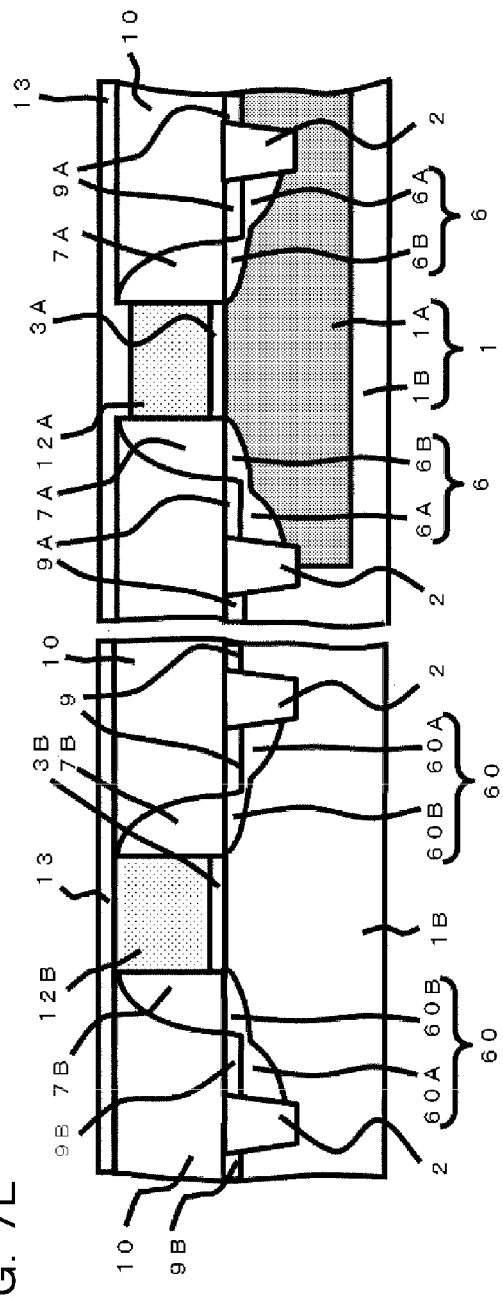

FIGS. 7K and 7L are cross-sectional diagrams each showing a part of the manufacturing process of a CMOS-type semiconductor apparatus according to the third embodiment.

FIG. 7K is a cross-sectional schematic diagram for major components showing a step of embedding amorphous silicon in the gap between the side walls that have been formed around the dummy gate electrode over the N-type MOS transistor formation region so that the second gate electrode is formed in a self-aligned manner and then removing the insulating film 5A from the gate electrode 40A. FIG. 7K shows, besides the configuration shown in FIG. 7J, the gate electrode 12B, which has been formed over the N-type MOS transistor formation region 1B, and a structure obtained by the removal of the insulating film 5A from the gate electrode 40A.

The step of forming the structure shown in FIG. 7K is detailed. After the situation shown in FIG. 7J is reached, CMP is performed on the entire laminate of the amorphous silicon 18 in order that the side walls 7A and 7B and the interlayer insulating film 10 are exposed, so that the second gate electrode 12B is formed from the amorphous silicon 18 in a self-aligned manner. Then, the insulating film 5A is removed from the gate electrode 40A using diluted hydrofluoric acid (HF).

FIG. 7L is a cross-sectional schematic diagram for major components showing a step of depositing nickel (Ni) on the first gate electrode 40A, which has been formed over the P-type MOS transistor formation region 1A, and on the second gate electrode 12B, which has been formed over the N-type MOS transistor formation region 1B. FIG. 7L shows nickel (Ni) 13 besides the configuration shown in FIG. 7K.

The step of forming the configuration shown in FIG. 7L is detailed. After the configuration shown in FIG. 7K is obtained, a laminate of nickel (Ni) 13 is formed on the entire surface including the top of the first gate electrode 40A, which has been formed over the P-type MOS transistor formation region 1A, and the top of the second gate electrode 12B, which has been formed over the N-type MOS transistor formation region 1B, by means of, for example, CVD or sputtering until the thickness thereof reaches approximately 60 nm.

FIGS. 7M and 7N are cross-sectional diagrams each showing a part of the manufacturing process of a CMOS-type semiconductor apparatus according to the third embodiment.

FIG. 7M is a cross-sectional schematic diagram for major components showing a step of completing the first gate electrode 14A with nickel silicides obtained by silicidating the amorphous silicon having controlled film characteristics for forming the first gate electrode over the P-type MOS transistor formation region 1A via the reaction with the nickel (Ni) 13 and completing the second gate electrode 14B with nickel silicides obtained by silicidating the amorphous silicon having controlled film characteristics for forming the second gate electrode in the N-type MOS transistor formation region 1B via the reaction with the nickel (Ni) 13. FIG. 7M shows, besides the configuration shown in FIG. 7L, the nickel-silicide-based first gate electrode 14A and the nickel-silicide-based second gate electrode 14B.

The step of forming the structure shown in FIG. 7M is detailed. After the situation shown in FIG. 7L is reached, RTA is performed for 60 seconds at a temperature of 400° C. so that the amorphous silicon having controlled film characteristics for forming the first gate electrode (obtained by heating the amorphous silicon) and the nickel (Ni) 13 react with each other and that the amorphous for forming the second gate electrode and the nickel (Ni) 13 react with each other. In this way, a nickel-silicide-based first gate electrode 14A and a nickel-silicide-based second gate electrode 14B are formed.

FIG. 7N is a cross-sectional schematic diagram for major components showing an unreacted nickel (Ni) removing step, laying out a structure obtained after the removal of unreacted portions of the nickel (Ni) 13 from the structure shown in FIG. 7M.

The step of forming the structure shown in FIG. 7N is detailed. After the situation shown in FIG. 7M is reached, the nickel-silicide-based first gate electrode 14A and the nickel-silicide-based second gate electrode 14B are immersed in a sulfuric-acid-containing solution, such as a mixture of sulfuric acid ($H_2SO_4$) and oxydol ($H_2O_2$), in order that unreacted portions of the nickel (Ni) 13 remaining on the top of the first and second gate electrodes 14A and 14B are removed.

After the subsequent steps of shaping the interlayer insulating film, contacts, and wiring are performed, a device equipped with the P-type MOS transistor and N-type MOS transistor according to this embodiment is completed.

FIG. 8 is a diagram showing data measured by the present inventor for a P-type MOS transistor and an N-type MOS transistor according to the third embodiment.

FIG. 8 shows the flat band voltages measured for a P-type MOS transistor and an N-type MOS transistor according to the third embodiment. The P-type MOS transistor contained nickel silicides formed via a reaction between amorphous silicon heated by RTA and nickel (Ni). The flat band voltage is one measured for a capacitor that is constituted by the above-described gate electrode, gate insulating film, and silicon substrate of the P-type MOS transistor.

The horizontal axis of the graph shown in FIG. 8 represents the RTA-based heat treatment steps to which the amorphous silicon composing each gate electrode was subjected. The conditions under which RTA was performed included a temperature of approximately 1000° C. and a period of time of 10 seconds. The flat band voltage of the P-type MOS transistor described above is represented by a filled circle enclosed with broken lines, whereas that of the N-type MOS transistor according to the third embodiment is represented by an open circle drawn with a solid line.

FIG. 8 shows that the flat band voltage of the P-type MOS transistor, which was heated by RTA, is −0.16 [V], whereas that of the N-type MOS transistor is 0.66 [V]. FIG. 8 also shows that the difference in flat band voltage between the P-type MOS transistor and the N-type MOS transistor according to the third embodiment is 0.48 [V].

This means that the difference in flat band voltage between a P-type MOS transistor and an N-type MOS transistor according to the third embodiment can be greater than that achieved in accordance with the second embodiment.

The method for manufacturing a CMOS-type semiconductor apparatus according to the third embodiment includes a step of preparing a substrate that has a P-type MOS transistor formation region taking on N-type conductivity and an N-type MOS transistor formation region taking on P-type conductivity, a gate insulating film formation step for forming a gate insulating film from a highly dielectric insulating film on the surface of the substrate, a step of forming a first gate electrode from amorphous silicon on the gate insulating film over the P-type MOS transistor formation region and, at the same time, forming a dummy gate electrode over the N-type MOS transistor formation region, a step of forming a side wall from an insulating material on both sides of the first gate electrode and the dummy gate electrode in such a manner that the side walls surround the first gate electrode and the dummy gate electrode, a heat treatment step for controlling the film characteristics of the amorphous silicon, a step of removing the dummy gate electrode from the N-type MOS transistor formation region, a step of forming a second gate electrode over the N-type MOS transistor formation region in a self-aligned manner by embedding amorphous silicon in the gap between the side walls formed around the dummy gate electrode, a subsequent step of depositing nickel (Ni) on the first and second gate electrodes, and a step of forming nickel silicides from the amorphous silicon having controlled film characteristics for forming the first gate electrode and the nickel (Ni) and from the amorphous silicon for forming the second gate electrode and the nickel (Ni).

The step of controlling the film characteristics of the first gate electrode formed over the P-type MOS transistor formation region is a heat treatment based on RTA and thus never changes the shape of the gate electrode. This provides simplicity in manufacturing gate electrodes composed of nickel silicides containing polyvalent nickel silicides (e.g., $Ni_3Si$) or those made of a basic nickel silicide (NiSi) on case-by-case basis.

In the method for manufacturing a CMOS-type semiconductor apparatus according to the third embodiment, the formation of the laminate of amorphous silicon involves the step of forming a second gate electrode over the N-type MOS transistor formation region by embedding amorphous silicon in the gap between the side walls formed around the dummy gate electrode. This allows the amorphous-silicon-based second gate electrode to be formed over the N-type MOS transistor formation region in a self-aligned manner.

The CMOS-type semiconductor apparatus according to the third embodiment contains a substrate that has a P-type MOS transistor formation region taking on N-type conductivity and an N-type MOS transistor formation region taking on P-type conductivity, a gate insulating film formed from a highly dielectric insulating film on the surface of the substrate, a P-type MOS transistor that is formed on the gate insulating film over the P-type MOS transistor formation region and has a first gate electrode composed of nickel silicides containing different kinds of silicide phases, and an N-type MOS transistor that is formed on the gate insulating film over the N-type MOS transistor formation region and has a second gate electrode composed of nickel silicides whose main ingredient is nickel monosilicide (NiSi).

The boundary between the second gate electrode formed in the N-type MOS transistor and the insulating film retains arsenic (As) segregating thereonto. The density of arsenic (As) segregating onto this boundary is desirably equal to or greater than $6 \times 10^{21}$ [$cm^{-3}$].

As described above, a CMOS-type semiconductor apparatus according to the third embodiment has the same structure as that according to the second embodiment and thus has the same effect as that according to the second embodiment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be under stood that the various changes, substitutions, and alterations could be made hereto without departing from the spirit and scope of the invention.

What is claimed is:

1. A method for manufacturing a P-type MOS transistor, the method comprising:
    forming a gate insulating film on a substrate; forming a dummy gate electrode on the gate insulating film; implanting an impurity into the substrate;
    annealing the substrate after the implanting the impurity into the substrate;
    removing the dummy gate electrode; forming a gate electrode from amorphous silicon on the gate insulating film; performing a heat treatment on the gate electrode depositing a nickel (Ni) layer on the gate electrode; and forming nickel silicides as the gate electrode.

2. The method for manufacturing a P-type MOS transistor according to claim 1, wherein the heat treatment is performed by RTA.

3. The method for manufacturing a P-type MOS transistor according to claim 1, wherein the gate insulating film is made of a highly dielectric insulating film.

4. The method for manufacturing a P-type MOS transistor according to claim 1, wherein the heat treatment is performed by irradiating the gate electrode with a laser.

5. A method for manufacturing a CMOS-type semiconductor apparatus, the method comprising:
  forming a gate insulating film on a substrate that has a P-type MOS transistor formation region and an N-type MOS transistor formation region;
  forming a first dummy gate electrode on the P-type MOS transistor formation region and
  second dummy gate electrode on the N-type MOS transistor formation region;
  implanting an impurity into the substrate; annealing the substrate after said implanting the impurity into the substrate; removing the first dummy gate electrode and the second dummy gate electrode; forming a first gate electrode from amorphous silicon on the gate insulating film over the P-type MOS transistor formation region and a second gate electrode from amorphous silicon on the gate insulating film over the N-type MOS transistor formation region;
  performing a heat treatment on the first gate electrode by irradiating the gate electrode with a laser; depositing nickel (Ni) on the first and second gate electrodes; and
  completing the first and second gate electrodes with nickel silicides via reactions between the first gate electrode and the nickel (Ni) and between the second gate electrode and the nickel (Ni).

6. The method for manufacturing a CMOS-type semiconductor apparatus according to claim 5, wherein the gate insulating film is made of a highly dielectric insulating film.

7. The method for manufacturing a CMOS-type semiconductor apparatus according to claim 5 further comprising, implanting the second gate electrode with arsenic (As) comes before the depositing nickel (Ni) on the first and second gate electrodes.

8. The method for manufacturing a CMOS-type semiconductor apparatus according to claim 7, wherein the amount of the arsenic (As) introduced during the implanting the second gate electrode with arsenic (As) is one that allows the arsenic to segregate onto the boundary between the second gate electrode and the gate insulating film at a density equal to or greater than $6\times10^{21}$ [cm$^{-3}$].

9. The method for manufacturing a CMOS-type semiconductor apparatus according to claim 5, wherein the forming the first gate electrode from amorphous silicon on the gate insulating film over the P-type MOS transistor formation region and the second gate electrode from amorphous silicon on the gate insulating film over the N-type MOS transistor formation region includes:
  forming a first dummy gate electrode that corresponds to the first gate electrode and a second dummy gate electrode that corresponds to the second gate electrode;
  forming side walls from an insulating material on both sides of the first dummy gate electrode and on both sides of the second gate electrode; removing the first and second dummy gate electrodes; and
  forming the first and second gate electrodes by embedding amorphous silicon only in the gap between the side walls.

10. The method for manufacturing a CMOS-type semiconductor apparatus according to claim 5, wherein the heat treatment is performed by irradiating the gate electrode with a laser.

11. A method for manufacturing a CMOS-type semiconductor apparatus, the method comprising:
  forming a gate insulating film on a substrate that has a P-type MOS transistor formation region and an N-type MOS transistor formation region;
  forming a first gate electrode for a P-type MOS transistor from amorphous silicon on the gate insulating film over the P-type MOS transistor formation region and a dummy gate electrode for an N-type MOS transistor on the gate insulating film over the N-type MOS transistor formation region;
  forming side walls on both sides of the first gate electrode and on both sides of the dummy gate electrode in such a manner that the side walls surround the first gate electrode and the dummy gate electrode;
  annealing the substrate after implanting a impurity into the substrate;
  performing a heat treatment on the gate electrode removing the dummy gate electrode;
  forming a second gate electrode by embedding amorphous silicon in the gap between the side walls;
  depositing nickel (Ni) on the first and second gate electrodes; and
  forming nickel silicides from the first gate electrode and the nickel (Ni) and from the second gate electrode and the nickel (Ni).

12. The method for manufacturing a CMOS-type semiconductor apparatus according to claim 11, wherein the gate insulating film is made of a highly dielectric insulating film.

13. The method for manufacturing a CMOS-type semiconductor apparatus according to claim 11, wherein the heat treatment is performed by RTA.

14. The method for manufacturing a CMOS-type semiconductor apparatus according to claim 11 further comprising, implanting the second gate electrode formed over the N-type MOS transistor formation region with arsenic (As) comes before the nickel (Ni) deposition.

15. The method for manufacturing a CMOS-type semiconductor apparatus according to claim 14, wherein the amount of the arsenic (As) introduced during the implanting the second gate electrode with arsenic (As) is one that allows the arsenic to segregate onto the boundary between the second gate electrode and the gate insulating film at a density equal to or greater than $6\times10^{21}$ [cm$^{-3}$].

* * * * *